(12) United States Patent
Jin et al.

(10) Patent No.: US 11,421,333 B2
(45) Date of Patent: Aug. 23, 2022

(54) HIGH PERFORMANCE EARTH-ABUNDANT ELECTROCATALYSTS FOR HYDROGEN EVOLUTION REACTION AND OTHER REACTIONS

(71) Applicant: Wisconsin Alumni Research Foundation, Madison, WI (US)

(72) Inventors: Song Jin, Madison, WI (US); Miguel Cabán-Acevedo, Pasadena, CA (US); Michael L. Stone, Minneapolis, MN (US)

(*) Notice: Subject to any disclaimer, the term of this patent is extended or adjusted under 35 U.S.C. 154(b) by 686 days.

(21) Appl. No.: 16/439,794

(22) Filed: Jun. 13, 2019

(65) Prior Publication Data

US 2019/0309426 A1 Oct. 10, 2019

Related U.S. Application Data

(62) Division of application No. 15/233,498, filed on Aug. 10, 2016, now abandoned.

(60) Provisional application No. 62/203,811, filed on Aug. 11, 2015.

(51) Int. Cl.
*C25B 11/075* (2021.01)
*C25B 1/02* (2006.01)
*C23C 14/00* (2006.01)

(52) U.S. Cl.
CPC ............ *C25B 11/075* (2021.01); *C23C 14/00* (2013.01); *C25B 1/02* (2013.01)

(58) Field of Classification Search
CPC .......................... C23C 16/305; H01M 4/9075
See application file for complete search history.

(56) References Cited

U.S. PATENT DOCUMENTS

| 3,961,987 A | * | 6/1976 | Mund | ...................... | H01M 4/90 429/527 |
| 2011/0206596 A1 | * | 8/2011 | Tenne | .................... | C01G 41/00 423/511 |

OTHER PUBLICATIONS

Faber et al., "High-Performance Electrocatalysis Using Metallic Cobalt Pyrite (CoS2) Micro- and Nanostructures", 2014, J. Am. Chem. Soc. 136, pp. 10053-10061. (Year: 2014).*

* cited by examiner

*Primary Examiner* — Robert A Vetere
(74) *Attorney, Agent, or Firm* — Bell & Manning, LLC

(57) ABSTRACT

Electrodes for catalyzing electrochemical reactions (e.g., the hydrogen evolution reaction) are provided. The electrode may comprise a ternary pyrite-phase transition metal phosphochalcogenide (e.g., CoPS) disposed on a substrate, wherein the ternary pyrite-phase transition metal phosphochalcogenide is a solid material of a ternary compound of a transition metal, phosphorous (P), and a chalcogen, the solid material characterized by a substantially single, ternary alloy phase having a pyrite crystal structure. Methods of using and making the electrodes are also provided.

20 Claims, 20 Drawing Sheets

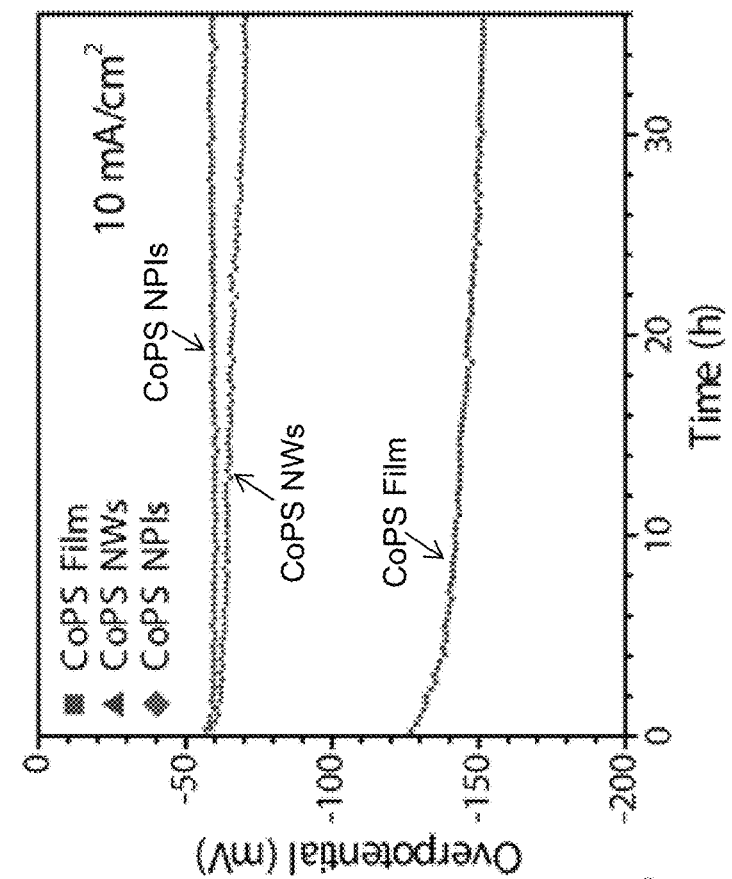
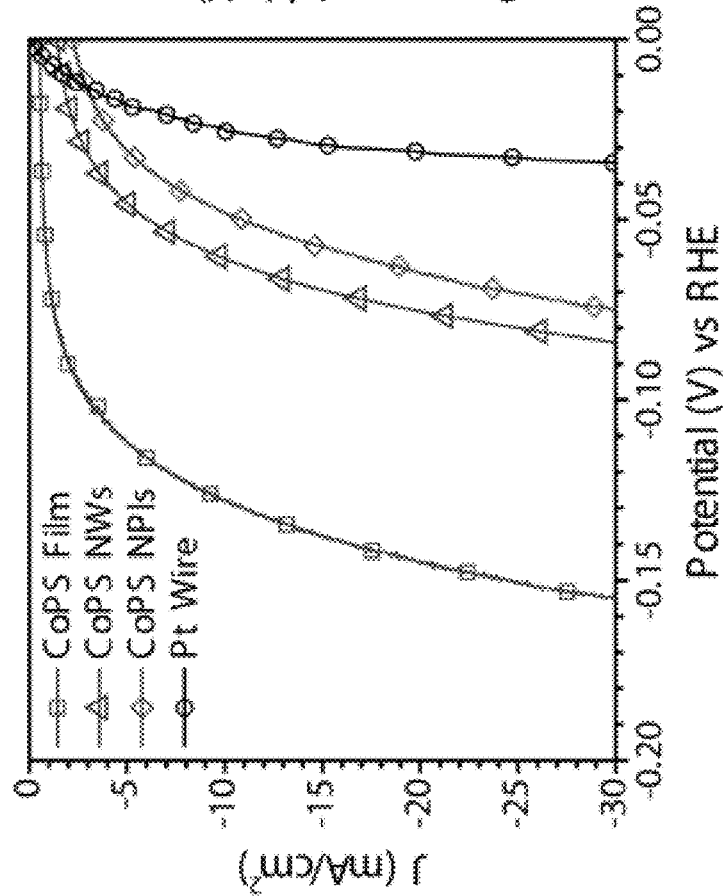
Fig. 3b
Fig. 3a

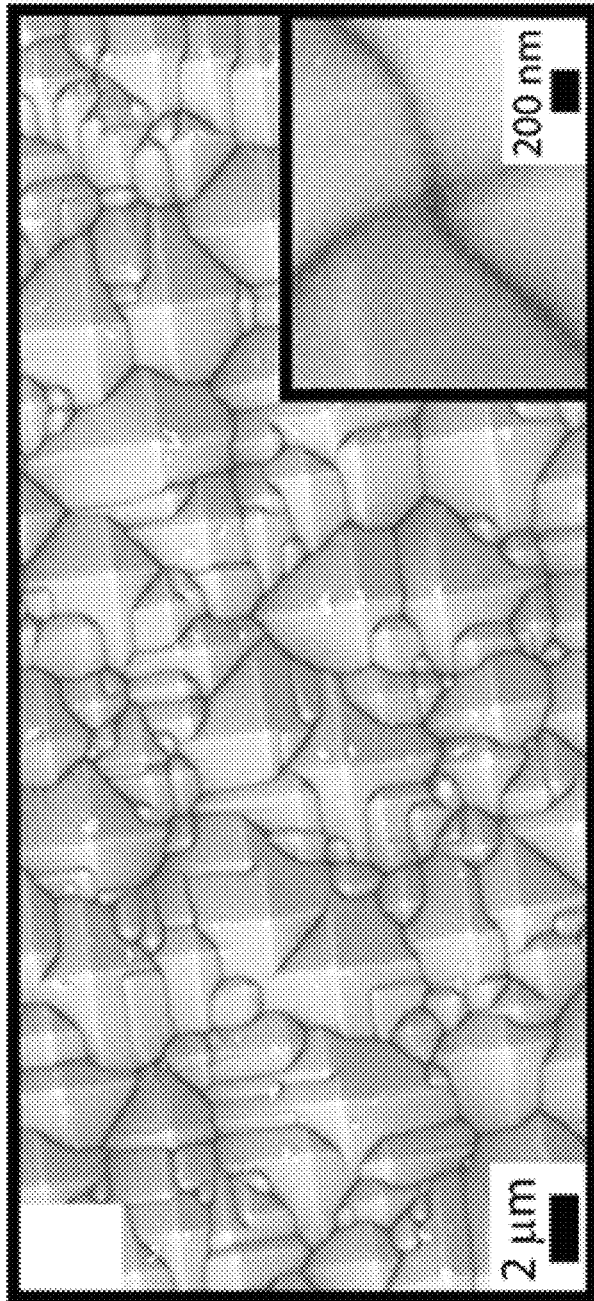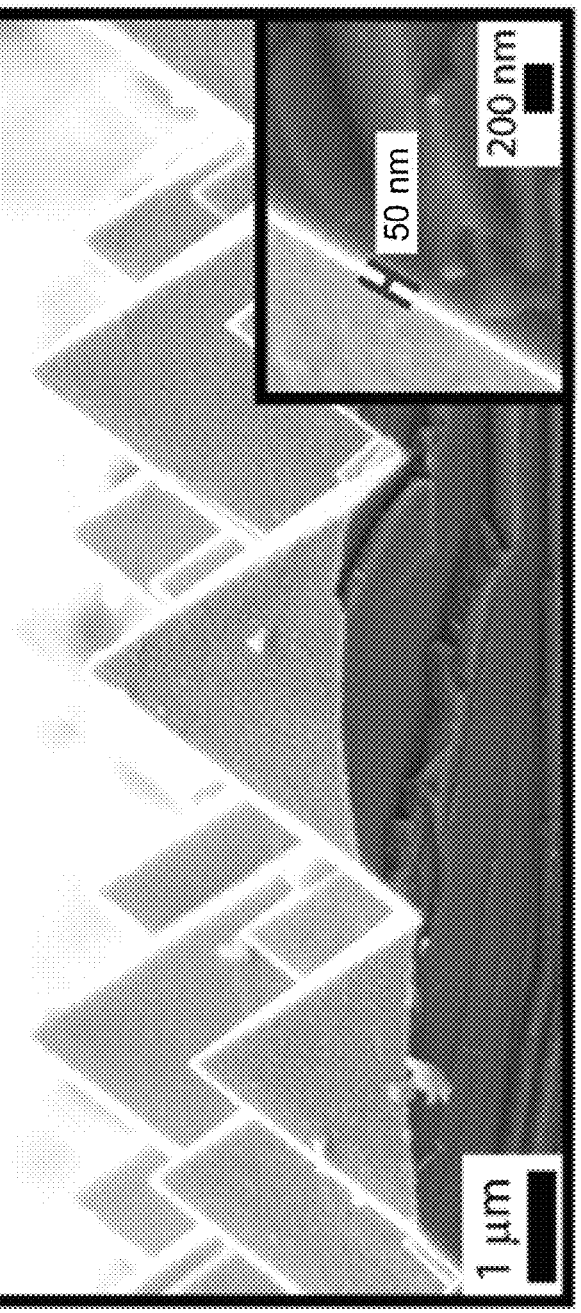
Fig. 4b
Fig. 4c

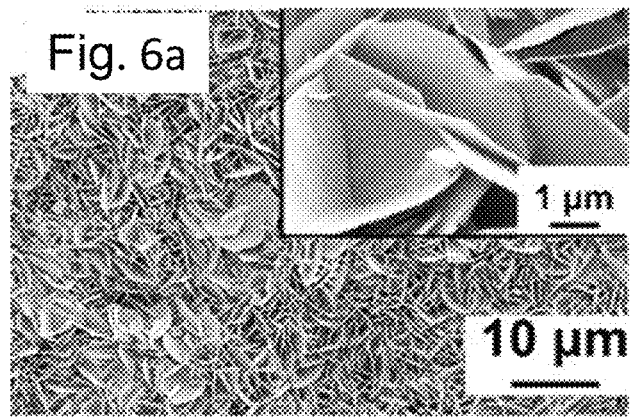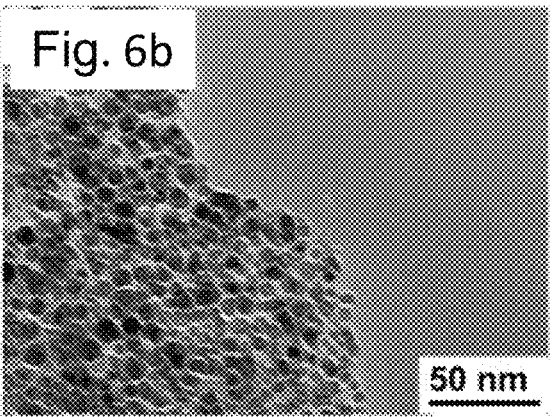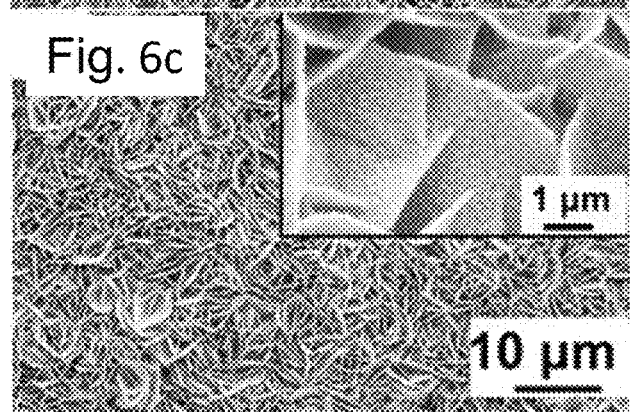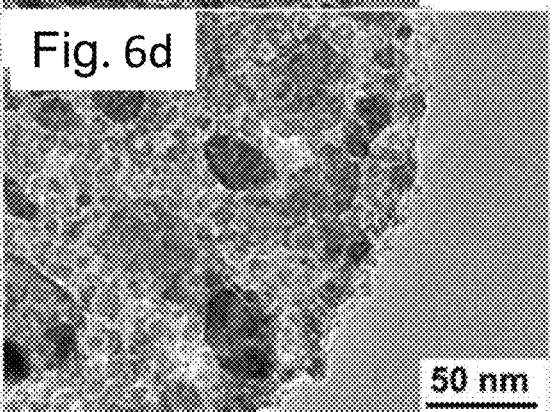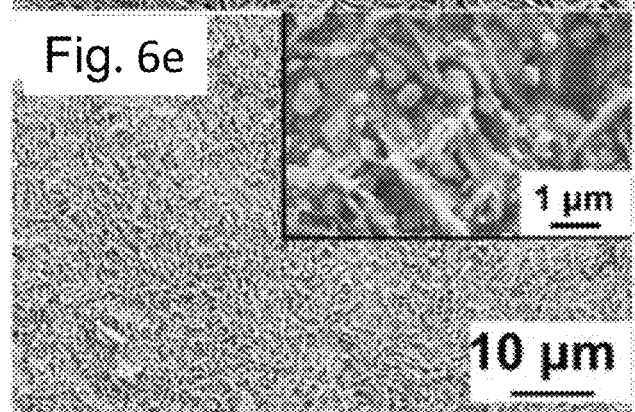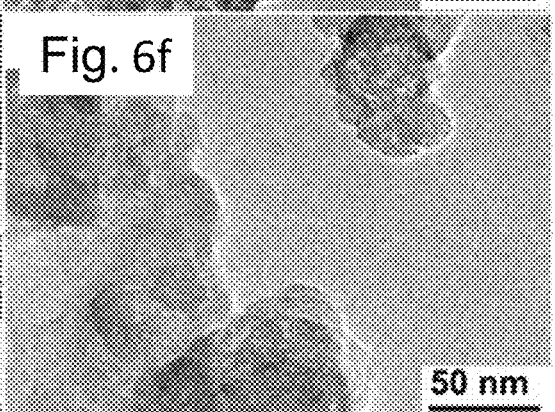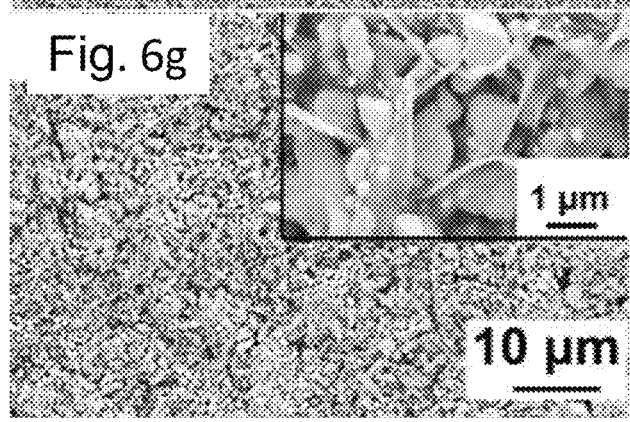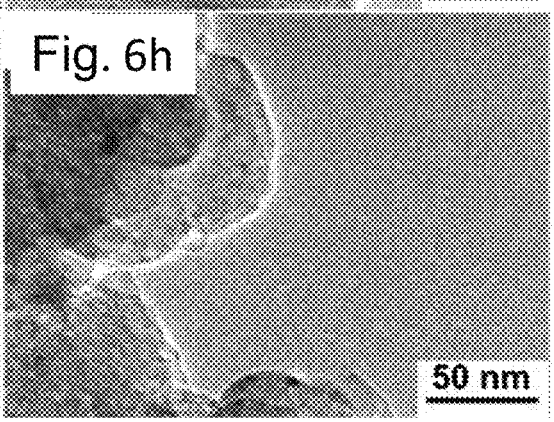

HIGH PERFORMANCE EARTH-ABUNDANT ELECTROCATALYSTS FOR HYDROGEN EVOLUTION REACTION AND OTHER REACTIONS

CROSS-REFERENCE TO RELATED APPLICATIONS

The present application is a divisional of U.S. patent application Ser. No. 15/233,498 filed on Aug. 10, 2016, the entire contents of which are hereby incorporated by reference; which claims priority to U.S. provisional patent application No. 62/203,811 filed Aug. 11, 2015, the entire contents of which are hereby incorporated by reference.

REFERENCE TO GOVERNMENT RIGHTS

This invention was made with government support under DE-SC0002162 awarded by the US Department of Energy. The government has certain rights in the invention.

BACKGROUND

Hydrogen is a sustainable energy carrier that promises an environmentally friendly alternative to meet the future global terawatt energy demand[1,2]. The production of hydrogen by means of water splitting, preferably solar-driven, requires highly efficient and robust catalyst materials[2]. Noble metals such as platinum are currently the most active catalysts for the hydrogen evolution reaction (HER). Unfortunately, their application in large scale hydrogen production is limited by high cost and low elemental abundance[3,4]. Thus, the search for cost-effective, earth-abundant materials with both high HER activity at low overpotentials and excellent stability has attracted significant research interest and become an important pursuit toward enabling a hydrogen economy. Various classes of earth-abundant transition metal compounds[4], such as $MoS_2$[5,6], $WS^{7,8}$, amorphous $MoS_x$[9], $CoS_2$[10], $CoSe_2$[11], $CoP$[12,13], $Ni_2P$[14], $FeP$[15], $MoP$[16,17], $MoP|S$[18], and Ni—Mo alloys[19], have been identified as promising HER electrocatalysts. Ultimately, it would be useful to integrate catalyst materials in solar-driven photoelectrochemical cells (PECs)[20].

Among the various earth-abundant HER catalysts recently discovered[4], the pyrite structure-type transition metal dichalcogenides ($MX_2$, where M=Fe, Co, or Ni and X=S or Se) have emerged as an interesting family of low cost materials with high catalytic activity toward the HER[10,11,21-23]. The family of metal pyrites includes semiconducting and metallic compounds that are very abundant as minerals or in sedimentary deposits within the earth's crust, which makes them appealing for a variety of energy conversion-related applications. For example, iron pyrite (cubic $FeS_2$; fool's gold) is a semiconductor that has been extensively studied as a promising cost-effective solar absorber[24,25], and has been studied as an HER catalyst[22,23]. Moreover, metallic cobalt pyrite ($CoS_2$; cattierite; FIG. 1a) has been found to display high catalytic activity toward HER[10], polysulfide and triiodide reduction reactions[21,22].

SUMMARY

Ternary pyrite-phase transition metal phosphochalcogenide electrocatalysts, methods of making the electrocatalysts, and methods of using the electrocatalysts to catalyze electrochemical reactions (e.g., the hydrogen evolution reaction) are provided.

In one aspect, electrodes for catalyzing electrochemical reactions are provided. In one embodiment, an electrode comprises a ternary pyrite-phase transition metal phosphochalcogenide disposed on a substrate, wherein the ternary pyrite-phase transition metal phosphochalcogenide is a solid material of a ternary compound of a transition metal, phosphorous (P), and a chalcogen, the solid material characterized by a substantially single, ternary alloy phase having a pyrite crystal structure.

In another aspect, methods for catalyzing electrochemical reactions are provided. In one embodiment, a method for catalyzing an electrochemical reaction comprises exposing an electrode to a fluid comprising an oxidant to be reduced in the presence of free electrons, wherein the electrode comprises a ternary pyrite-phase transition metal phosphochalcogenide disposed on a substrate, wherein the ternary pyrite-phase transition metal phosphochalcogenide is a solid material of a ternary compound of a transition metal, phosphorous (P), and a chalcogen, the solid material characterized by a substantially single, ternary alloy phase having a pyrite crystal structure, whereby the free electrons induce the reduction of the oxidant at the ternary pyrite-phase transition metal phosphochalcogenide-fluid interface to form a reduction product.

In another aspect, methods for making electrodes are provided. In one embodiment, a method comprises exposing a transition metal-containing precursor disposed on a substrate to a chalcogen-phosphorous atmosphere at an elevated temperature and for a period of time sufficient to convert the transition metal-containing precursor to a ternary pyrite-phase transition metal phosphochalcogenide, wherein the ternary pyrite-phase transition metal phosphochalcogenide is a solid material of a ternary compound of a transition metal, phosphorous (P), and a chalcogen, the solid material characterized by a substantially single, ternary alloy phase having a pyrite crystal structure.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIG. 2e shows EDS spectra and FIG. 2f shows confocal micro-Raman spectra for CoPS film and CoPS NWs on graphite, and CoPS NPls on carbon fiber paper. The peak positions for the $E_g$ and $A_g$ Raman modes for $CoS_2$ were included as vertical dash lines for comparison. FIG. 2g shows the PXRD patterns for various CoPS products with different morphologies in comparison to simulated pattern for cubic CoPS (ICSD collection code #62414) and standard pattern for $CoS_2$ (JCPDS #41-1471). Note that the CoPS film measured by PXRD was grown on borosilicate glass. A minor marcasite-type CoPS polymorph phase (Pmnn, orthorhombic CoPS) was observed in this sample (labeled as "m"). All peaks corresponding to graphite and carbon paper were labeled as "*".

FIGS. 3a-3f illustrate the electrochemical characterization of CoPS film on graphite, CoPS nanowires (NWs) on graphite and CoPS nanoplates (NPls) on carbon fiber paper electrodes for HER catalysis. FIG. 3a includes J-V curves after iR correction, showing the catalytic performance of the CoPS electrodes (film, open squares; NWs, open triangles; NPls, open diamonds) in comparison to a Pt wire (open circles). FIG. 3b shows a long-term stability test for CoPS electrodes at a current density of 10 mA/$cm^2$. FIG. 3c shows a Tafel plot for the data presented in panel FIG. 3a. FIG. 3d includes a plot showing the extraction of the double-layer capacitance ($C_{dl}$) for each type of CoPS electrode. FIGS. 3e, 3f show electrochemical impedance spectroscopy (EIS) Nyquist plots for CoPS electrodes. The data were fitted using modified Randles circuits shown in insets.

FIGS. 4a-4c demonstrate photoelectrochemical hydrogen generation using integrated CoPS/Si photocathodes. FIG. 4a includes J-V curves under dark and 1 Sun (100 mW/$cm^2$, AM 1.5) illumination in 0.5 M $H_2SO_4$, obtained for thermally converted 3 nm (down triangles), 5 nm (up triangles), 7.5 nm (diamonds), 10 nm (squares) and 15 nm (circles) cobalt films in comparison with 5 nm Pt film (solid trace), on $n^+$-p-$p^+$ micropyramid silicon. A planar CoPS/p-silicon electrode obtained by thermal conversion of 10 nm Co on p-Si is shown in comparison. FIGS. 4b, 4c show SEM images of CoPS/$n^+$-p-$p^+$ micropyramid silicon photoelectrode obtained by conversion of 10 nm Co film, showing (FIG. 4b) top-down and (FIG. 4c) cross-section views of the surface.

FIGS. 6a-6h show SEM and TEM images of the $NiP_2$ (FIGS. 6a, 6b) $NiP_{1.93}Se_{0.07}$ (FIGS. 6c, 6d), $NiP_{0.09}Se_{1.91}$ (FIGS. 6e, 6f) and $NiSe_2$ (FIGS. 6g, 6h) nanostructures.

FIG. 10a shows the polarization curves and FIG. 10b shows the corresponding Tafel plot.

DETAILED DESCRIPTION

Figure 1A:
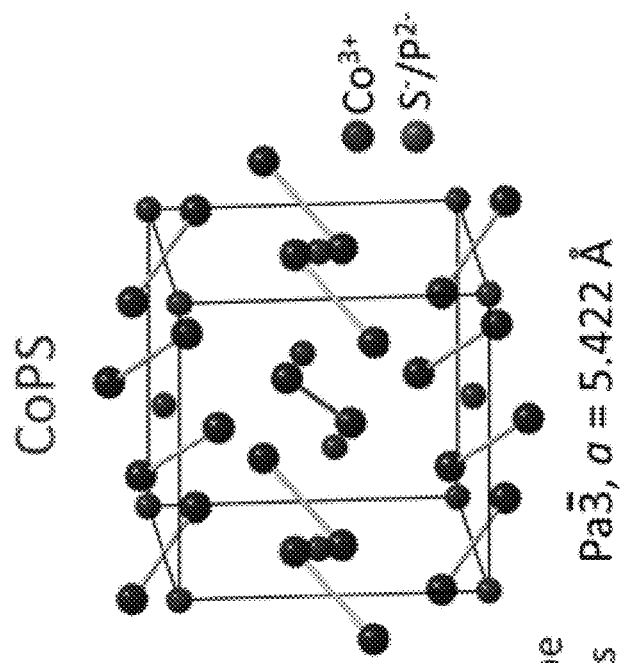
FIGS. 1a-1c demonstrate the design of the ternary pyrite CoPS catalyst and the results from DFT calculations. The crystal structure of cobalt pyrite ($CoS_2$) (FIG. 1a), intrinsic {100} pyrite surface coordination environment (FIG. 1b), and crystal structure of pyrite-type cobalt phosphosulfide (CoPS) (FIG. 1c) are shown. The free energy diagram is shown in FIG. 1d for hydrogen (H*) adsorption at the Co site on the {100} surface of $CoS_2$, and at the Co site, P site, and Co site after H* at P site on the {100} surface of CoPS. Note that density function theory (DFT) calculations for CoPS were performed for ordered P—S dumbbells for simplicity.

Ternary pyrite-phase transition metal phosphochalcogenide electrocatalysts, methods of making the electrocatalysts, and methods of using the electrocatalysts to catalyze electrochemical reactions (e.g., the hydrogen evolution reaction) are provided. It is found that the catalytic performance of the disclosed ternary pyrite-phase transition metal phosphochalcogenide electrocatalysts is superior to known electrocatalysts made of earth-abundant elements, such as transition metal chalcogenides and transition metal phosphides, and is approaching the catalytic performance of platinum and other noble metal elements. In addition, it is found that performance of the disclosed ternary pyrite-phase transition metal phosphochalcogenide electrocatalysts in solar-driven hydrogen production via the hydrogen evolution reaction is surprisingly competitive with the significantly more expensive platinum containing photoelectrodes.

A method for catalyzing an electrochemical reaction may comprise exposing ternary pyrite-phase transition metal phosphochalcogenide to a fluid comprising an oxidant to be reduced in the presence of free electrons. The free electrons induce the reduction of the oxidant at the ternary pyrite-phase transition metal phosphochalcogenide-fluid interface to form a reduction product, which may be separated from the fluid and collected. The free electrons may be derived from an external power source in electrical communication with the ternary pyrite-phase transition metal phosphochalcogenide such that the reduction reaction is an electrochemical reduction. The free electrons may be derived from the absorption of light by a semiconductor and collection of photoexcited carriers, the semiconductor in electrical communication with the ternary pyrite-phase transition metal phosphochalcogenide, such that the reduction reaction is a photoelectrochemical reduction. The benefits of using the more efficient ternary pyrite-phase transition metal phosphochalcogenides include reducing the overpotential needed for the reduction reactions and the kinetic barriers associated with the reduction reactions.

The ternary pyrite-phase transition metal phosphochalcogenide electrocatalysts may be used to catalyze the hydrogen evolution reaction (HER), an electrochemical reaction in which hydrogen ($H_2$) is produced via the electrolysis of water ($H_2O$). The hydrogen evolution reaction may be carried out in a reaction cell comprising an anode and a cathode immersed in an aqueous solution (e.g., a solution of water and a water-soluble electrolyte such as $H_2SO_4$). The aqueous solution may be acidic, neutral or basic. The anode and cathode may be separated by a membrane. When an electrical potential is applied across the anode and the cathode, dissociated hydrogen ions ($H^+$) migrate to the cathode where they are reduced to produce $H_2$, which may be separated from the aqueous solution and collected. At the anode, water reacts to form oxygen ($O_2$), hydrogen ions and electrons. The ternary pyrite-phase transition metal phosphochalcogenide electrocatalysts may be used to catalyze the reduction reaction of HER, i.e., the reduction of hydrogen ions to $H_2$ at the cathode.

However, the ternary pyrite-phase transition metal phosphochalcogenide electrocatalysts may be used to catalyze other electrochemical reactions besides HER. In some embodiments, the electrochemical reaction is a polysulfide reduction reaction. In other embodiments, the electrochemical reaction is a triiodide reduction reaction. Both reactions may be carried out in a reaction cell similar to that described above for HER. In a polysulfide reduction reaction, elemental sulfur dissolved in aqueous solution (in the forms of various $S_x^{n-}$ ions, the so-called polysulfide ions) is reduced by the free electrons at the electrocatalyst-electrolyte interface at the cathode to form $S^{2-}$ ions. In a triiodide reduction reaction, $I_2$ molecules complexed with $I^-$ dissolved in aqueous solution (e.g. the triiodide ions ($I_3^-$)) are reduced by the free electrons at the electrocatalyst-electrolyte interface at the cathode to form iodide ions ($I^-$). In yet other embodiments, the electrochemical reaction is a carbon dioxide ($CO_2$) reduction reaction. In such a reaction, $CO_2$ may be reduced by the free electrons at the electrocatalyst-electrolyte interface at the cathode to form products such as CO. The benefits of using the more efficient ternary pyrite-phase transition metal phosphochalcogenides include reducing the kinetic overpotentials needed for these reduction reactions.

For purposes of this disclosure, the term "ternary pyrite-phase transition metal phosphochalcogenide" refers to a solid material of a ternary compound of a transition metal, phosphorous (P), and a chalcogen, the solid material characterized by a substantially single, ternary alloy phase having a pyrite crystal structure. Thus, the ternary pyrite-phase transition metal phosphochalcogenides are distinguished from solid materials having two or more distinct phases. The ternary pyrite-phase transition metal phosphochalcogenide may have the formula MPX, wherein M is a transition metal selected from Co, Ni, Fe and Mn, P is phosphorus, and X is a chalcogen selected from S, Se and Te. In some embodiments, the ternary pyrite-phase transition metal phosphochalcogenide is ternary pyrite-phase cobalt phosphosulfide. In some embodiments, the ternary pyrite-phase transition metal phosphochalcogenide is ternary pyrite-phase cobalt phosphoselenide. Each of these formulae also encompasses solid materials in which the amount of phosphorous and the amount of chalcogen in the solid material deviate slightly from ideal, e.g., non-stoichiometric $CoP_{0.83}S_{1.35}$ versus stoichiometric CoPS. In such materials, the amount of phosphorous and the amount of chalcogen may be considered to be "substantially stoichiometric." Larger deviations are also encompassed, e.g., $NiP_{1.93}Se_{0.07}$, which may be referred to as Se-doped $NiP_2$.

In some embodiments, the ternary pyrite-phase transition metal phosphochalcogenide is an alloyed ternary pyrite-phase transition metal phosphochalcogenide including more than one transition metal (e.g., two), phosphorous (P) and a chalcogen. An alloyed ternary pyrite-phase transition metal phosphochalcogenide is also a solid material characterized by a substantially single, ternary alloy phase having a pyrite crystal structure. Alloyed ternary pyrite-phase transition metal phosphochalcogenides may have the formula MPX as described above, but the transition metal component M includes more than one type of transition metal, e.g., $M_1$ and $M_2$. As described above, the transition metals may be selected from Co, Ni, Fe and Mn.

As described in the Examples, below, the ternary pyrite-phase transition metal phosphochalcogenide electrocatalysts are distinguished from electrocatalysts which may be composed of a transition metal element, phosphorous and a chalcogen, but which are characterized by distinct chemical species in distinct regions of the material, e.g., bulk chemical species which differ from surface chemical species. By way of illustration, the ternary pyrite-phase transition metal phosphochalcogenide electrocatalysts are distinguished from MoP|S, which is the compound MoP having a surface modified with sulfur atoms. (See reference 18.) That is, the ternary pyrite-phase transition metal phosphochalcogenide electrocatalysts do not include MoP|S. By contrast, the ternary pyrite-phase transition metal phosphochalcogenide electrocatalysts are characterized by exhibiting substantial chemical uniformity and homogeneity throughout the material. This means that the type(s) of chemical species existing in the bulk of the material are the same (although not necessarily perfectly the same) as the type(s) of chemical species existing at the surface of the material. Such chemical uniformity and homogeneity may be confirmed using the techniques described in the Examples below, e.g., via X-ray photoelectron spectroscopy (XPS) measurements.

The ternary pyrite-phase transition metal phosphochalcogenide may be provided as a film or layer or coating of the solid material disposed on an underlying substrate to provide an electrode (e.g., cathode) that can be immersed in the fluid comprising the oxidant. A variety of substrates may be used, and may depend upon whether the reduction reaction to be catalyzed is an electrochemical reduction or a photoelectrochemical reduction. The substrate is typically a conductive substrate. By way of illustration, carbon substrates (e.g., graphite, glassy carbon, carbon fiber paper, carbon cloth, porous carbon, carbon nanotube networks, interconnected graphene networks, etc.) and stable metal substrates (e.g., Ti foil or plate) are suitable substrates for electrochemical reductions.

For photoelectrochemical reductions, the substrate comprises a semiconductor capable of absorbing light (e.g., solar radiation) to produce free electrons which are collected and transported to the ternary pyrite-phase transition metal phosphochalcogenide-fluid interface where they induce the reduction reaction. Various semiconductors may be used, and may depend upon the wavelength(s) of light to be absorbed. By way of illustration, silicon, indium phosphide (InP), and gallium phosphide (GaP) are suitable substrates. The substrate may further comprise an emitter layer (e.g., $n^+$ doped silicon) disposed on a surface of the semiconductor, the emitter layer configured to mitigate or eliminate the influence of the ternary pyrite-phase transition metal phosphochalcogenide on band bending in the selected semiconductor. The substrate may further comprise a back surface field layer (e.g., $p^+$ doped silicon) disposed on an opposing surface of the semiconductor, the back surface field layer configured to facilitate collection of the electrons generated by the absorption of light. The surfaces of the semiconductor may be structured or textured to enhance light harvesting. By way of illustration, the surfaces may comprise a plurality of micropyramids extending away from the surfaces. The micropyramids may exhibit an average maximum dimension of a few microns or less, e.g., about 5 μm or less, about 2 μm or less in the range of from about 1 μm to about 5 μm, etc. Nanopyramids may also be used.

Various morphologies of the ternary pyrite-phase transition metal phosphochalcogenide may be used. The ternary pyrite-phase transition metal phosphochalcogenide may be nanostructured, by which it is meant that the material is composed of distinct, distinguishable nanostructures (e.g., as visualized via scanning electron microscope images) having at least one dimension of about 1000 nm or less, i.e., in the range of from about 1 nm to about 1000 nm. In some embodiments, the nanostructures are roughly spherical in shape having an average diameter (or average maximum width for irregularly shaped nanostructures) of less than about 1000 nm. Typically, the average diameter (or average maximum width) is much smaller, e.g., less than about 100 nm, less than about 10 nm, or in the range of from about 1 nm to about 5 nm. For purposes of this disclosure, such roughly spherical nanostructures will be referred to as "nanoparticles."

In other embodiments, the nanostructures are in the form of nanowires having an average diameter which is on the order of nanometers, i.e., in the range of from about 1 nm to about 1000 nm. Typically the average diameter is much smaller, e.g., less than about 100 nm, less than about 50 nm, or in the range of from about 10 nm to about 100 nm. The average length of the nanowires, which is greater than the average diameter of the nanowires, may be on the order of microns, e.g., in the range of from about 1 μm to about 10 μm. The nanowires may extend substantially vertically away from the surface of the underlying substrate.

In other embodiments, the nanostructures are in the form of nanoplates which are akin to flattened nanowires. Nanoplates may also be referred to as nanoflakes or nanosheets. The nanoplates may have an average thickness which is on the order of nanometers, i.e., in the range of from about 1 nm to about 1000 nm. Typically the average thickness is much smaller, e.g., less than about 100 nm, less than about 50 nm, or in the range of from about 10 nm to about 100 nm. The average length of the nanoplates, which is greater than the average thickness of the nanoplates, may be on the order of microns, e.g., in the range of from about 1 μm to about 10 μm. The average width of the nanoplates is typically also greater than the average thickness, but the average width may be on the order of nanometers, e.g., in the range of from about 100 nm to 1000 nm. Such nanoplates may adopt a porous pumice-like structure in which the nanoplates are randomly oriented and edges of neighboring nanoplates are merged to define a plurality of irregularly shaped cavities or pores dispersed throughout the structure.

Other nanostructures may be used, including branched nanostructures.

The selection of the underlying substrate may provide additional morphological elements to the ternary pyrite-phase transition metal phosphochalcogenide electrodes. By way of illustration, ternary pyrite-phase transition metal phosphochalcogenide nanoparticles disposed on a graphite substrate provides coated flakes having an average diameter or average maximum width on the order of microns, e.g., in the range of from about 1 μm to about 10 μm. Ternary pyrite-phase transition metal phosphochalcogenide nanowires disposed on a graphite substrate provides blooms composed of nanowires extending and radiating outwardly from a common center. The blooms may have an average diameter on the order of microns, e.g., in the range of from about 5 μm to about 20 μm. Ternary pyrite-phase transition metal phosphochalcogenide nanoplates disposed on carbon fiber paper provides coated elongated rods having an average diameter on the order of microns, e.g., in the range of from about 10 μm to about 20 μm.

The particular morphology of the ternary pyrite-phase transition metal phosphochalcogenide, the selection of the underlying substrate, and the average thickness or surface coverage of the ternary pyrite-phase transition metal phosphochalcogenide may be selected to maximize overall catalytic performance, facilitate hydrogen bubble nucleation and release and/or to minimize interference with the absorption of light by a semiconductor of the underlying substrate (if present).

The ternary pyrite-phase transition metal phosphochalcogenide electrodes may be made via thermal conversion of a transition metal-containing precursor disposed on a substrate in a chalcogen-phosphorous atmosphere. In one embodiment, a transition metal-containing precursor disposed on a substrate is exposed to a chalcogen-phosphorous atmosphere at an elevated temperature and for a period of time sufficient to convert the transition metal-containing precursor to the ternary pyrite-phase transition metal phosphochalcogenide. By way of illustration, a suitable range of temperature is from about 400° C. to about 700° C. and a suitable range of time is from about 5 minutes to about 2 hours for the thermal conversion. The temperature and time may depend upon the thickness of the film or layer or coating of the transition metal-containing precursor. The chalcogen-phosphorous atmosphere may further comprise an inert gas, e.g., argon. However, the chalcogen-phosphorous atmosphere may be substantially free of any air or oxygen. The chalcogen-phosphorous atmosphere may be formed by the thermal evaporation of a substantially 1:1 stoichiometric mixture of phosphorous and chalcogen elemental powders under an inert gas. Selection of the chalcogen depends upon the desired ternary pyrite-phase transition metal phosphochalcogenide. Any of the substrates described herein may be used.

The ternary pyrite-phase transition metal phosphochalcogenide electrodes may also be made by carrying out the thermal conversion reaction in solution in a suitable solvent, e.g., water in a hydrothermal environment or other high boiling point solvents. In this case, the temperature may be in the range of from about 150° C. to about 300° C.

Selection of the transition metal-containing precursor depends upon the desired ternary pyrite-phase transition metal phosphochalcogenide as well as the desired nanostructure or microstructure morphology. The transition metal-containing precursor may be a film of a transition metal, which may be deposited on a substrate, e.g., via thermal evaporation. Thermal conversion of the film of transition metal as described herein provides the substrate coated with ternary pyrite-phase transition metal phosphochalcogenide nanoparticles.

Alternatively, the transition metal-containing precursor may be a layer or a coating of transition metal-containing nanostructures, e.g., nanowires or nanoplates. By way of illustration, transition metal hydroxide carbonate hydrate nanowires may be grown on a substrate, e.g., via a hydrothermal growth technique. Thermal conversion of the transition metal hydroxide carbonate hydrate nanowires as described herein provides the substrate coated with ternary pyrite-phase transition metal phosphochalcogenide nanowires. As another illustration, transition metal hydroxide carbonate hydrate nanoplates may be grown via a two-step process. First, transition metal oxide nanoparticles may be deposited on a substrate, e.g., via dip-coating the substrate in an ink of the transition metal oxide nanoparticles. Second, the coated substrate may be subjected to the same hydrothermal growth technique described herein to grow transition metal hydroxide carbonate hydrate nanoplates on the substrate. Thermal conversion of the transition metal hydroxide carbonate hydrate nanoplates as described herein provides the substrate coated with ternary pyrite-phase transition metal phosphochalcogenide nanoplates. Other transition-metal containing nanostructures besides transition metal hydroxide carbonate hydrates may be thermally converted to ternary pyrite-phase transition metal phosphochalcogenide nanostructures using procedures described above. Such other transition-metal containing nanostructures may include transition metal oxides, oxyhyrdoxides, hydroxides, fluorides, chlorides, and bromides.

The electrochemical reactions to be catalyzed by the ternary pyrite-phase transition metal phosphochalcogenide electrocatalysts may be conducted in an electrochemical reaction system. The electrochemical reaction system may comprise a reaction cell configured to contain a fluid comprising an oxidant to be reduced; a ternary pyrite-phase transition metal phosphochalcogenide electrode immersed in the fluid; and a counter electrode. A membrane may be included to separate the ternary pyrite-phase transition metal phosphochalcogenide electrode and the counter electrode. Any of the ternary pyrite-phase transition metal phosphochalcogenide electrodes described herein may be used. The selection of fluid depends upon the particular electrochemical reaction to be catalyzed by the ternary pyrite-phase transition metal phosphochalcogenide. For the hydrogen evolution reaction, the fluid may be an aqueous electrolyte solution (e.g., a solution of water and a water-soluble electrolyte such as $H_2SO_4$), the oxidants may comprise hydrogen ions and the reduction product may comprise hydrogen gas. Various materials for the counter electrode may be used (e.g., graphite). The counter electrode may be immersed in the fluid. The counter electrode may be in electrical communication with the ternary pyrite-phase transition metal phosphochalcogenide electrode. The electrochemical reaction system may further comprise a collection cell configured to collect the reduction product from the reaction cell.

The electrochemical reaction system may further comprise a power source in electrical communication with the ternary pyrite-phase transition metal phosphochalcogenide electrode and the counter electrode, the power source configured to apply an electrical potential across the ternary pyrite-phase transition metal phosphochalcogenide electrode and the counter electrode in order to generate the free electrons for electrochemically inducing the reduction reaction.

Alternatively, or in addition, the electrochemical reaction system may further comprise a light source configured to illuminate at least a portion of the ternary pyrite-phase transition metal phosphochalcogenide electrode with light to generate the free electrons for photoelectrochemically inducing the reduction reaction. The light source may be selected to emit light having a wavelength capable of being absorbed by the selected semiconductor substrate of the ternary pyrite-phase transition metal phosphochalcogenide electrode to produce the free electrons. However, since the light source may simply be solar radiation an external light source may not be necessary.

Also provided are electrocatalysts in which arsenic is used in place of phosphorous in the ternary pyrite-phase transition metal phosphochalcogenide. The description of such electrocatalysts, electrochemical reaction systems comprising such electrocatalysts, methods of using such electrocatalysts and methods of making such electrocatalysts follows that described above with respect to the ternary pyrite-phase transition metal phosphochalcogenides, except that arsenic replaces phosphorous. Such compounds may be referred to as ternary pyrite-phase transition metal arsenochalcogenide electrocatalysts.

EXAMPLES

Example 1: Cobalt Phosphosulfide Electrocatalysts

Abstract

The scalable and sustainable production of hydrogen fuel through water splitting demands efficient and robust earth-abundant catalysts for the hydrogen evolution reaction (HER). Building on promising metal compounds with high HER catalytic activity, such as pyrite structure cobalt disulfide ($CoS_2$), and substituting non-metal elements to tune the hydrogen adsorption free energy has been shown in this example to lead to further improvements in catalytic activity. A combined theoretical and experimental study is presented in this example to establish ternary pyrite-type cobalt phosphosulfide (CoPS) as a high-performance earth-abundant catalyst for electrochemical and photoelectrochemical hydrogen production. Nanostructured CoPS electrodes achieved geometrical catalytic current density of 10 $mA/cm^2$ at overpotentials as low as 48 mV with outstanding long-term operation stability. Integrated photocathodes of CoPS on $n^+$-p-$p^+$ silicon micropyramids achieved photocurrents up to 35 $mA/cm^2$ at 0 V vs the reversible hydrogen electrode (RHE) and onset photovoltages as high as 450 mV vs RHE, and the most efficient solar-driven hydrogen generation from earth-abundant systems.

Introduction

Figure 1B:
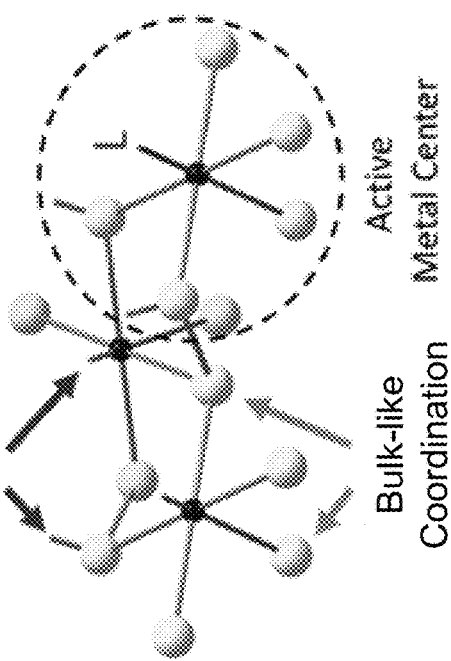

As noted in the background, certain pyrite compounds have exhibited HER catalytic activity. However, there is no direct evidence for the active site(s) and mechanism responsible for the high HER catalytic activity of these pyrite compounds. Yet, strong similarities between the active metal centers of Fe-only hydrogenase[26,27] and the reduced coordination environment of the intrinsic {100} pyrite surface[24] suggest that the active sites are the square-pyramidal surface metal centers bridged by dichalcogenide dumbbells (FIG. 1b). Such similarities may suggest that the HER mechanism of pyrite compounds could involve a distorted octahedral metal hydride. Thus, its stability and reactivity (hydricity) can be influenced by the electron-donating character of the chalcogen ligands (X)[28]. Therefore, the inventors investigated whether the HER catalytic activity of metal chalcogenides could be improved through tuning the hydrogen adsorption free energy by changing the atomic components of the $X_2^{2-}$ dumbbells, while still preserving the pyrite structure. Given the weaker electronegativity of phosphorus in comparison to sulfur and the absence of thermodynamically stable metal diphosphides under ambient conditions[29], this example presents the investigation of pyrite-type cobalt phosphosulfide (CoPS) as a novel ternary catalyst for HER.

Figure 1C:
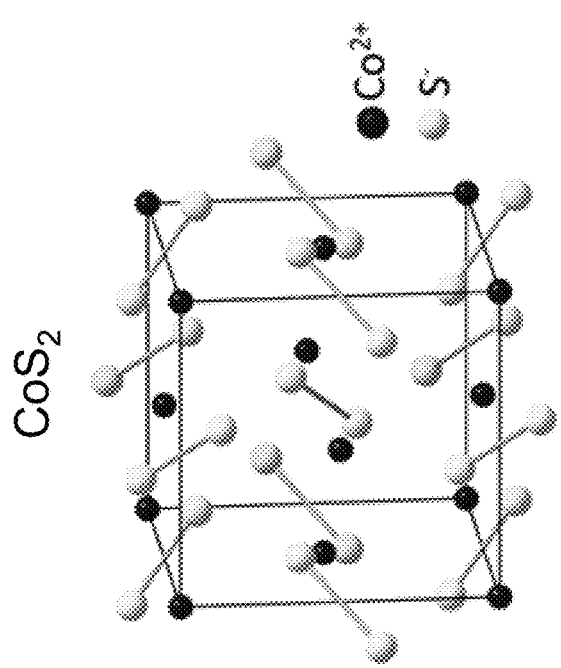

Cobalt phosphosulfide was identified in the 1960s to be a pyrite compound analogous to the naturally occurring mineral cobaltite (CoAsS)[30], but its properties have not been investigated. The cubic crystal structure of CoPS can be visualized similarly to that of $CoS_2$ (FIG. 1a), but instead of $Co^{2+}$ octahedra and $S_2^{2-}$ dumbbells, CoPS has $Co^{3+}$ octahedra and dumbbells with homogeneous distribution of $P^{2-}$ and $S^-$ atoms (FIG. 1c), and a smaller lattice constant (a=5.422 Å vs. 5.538 Å for $CoS_2$). In contrast to $CoS_2$, which is a half-metal, CoPS has one less valence electron, making it a semiconductor isoelectronic to iron pyrite. Since the Co octahedra in CoPS contain $P^{2-}$ ligands with higher electron-donating character than $S^-$ ligands, the inventors investigated whether this ternary pyrite compound could have higher HER catalytic activity than $CoS_2$ due to a more thermoneutral hydrogen adsorption at the active sites. Despite the potential for tunable electronic and chemical properties, ternary or more complex metal compounds, especially those containing different non-metal elements, have rarely been explored for electrocatalysis[4]. Herein the theoretical study of the hydrogen evolution activity for CoPS surface, the synthesis of CoPS nanostructures and their excellent performance toward HER electrocatalysis and solar-driven hydrogen production is reported for the first time.

Methods

Free Energy Calculations for Atomic Hydrogen Adsorption ($\Delta G_H^*$).

Chemisorption free energies were obtained for both $CoS_2$ and CoPS using density functional theory (DFT) calculations. All calculations were performed using the Vienna Ab-initio Simulation Package (VASP)[46-48] using the Perdew-Burke-Ernzerhof (PBE) GGA exchange-correlation functional and the projector augmented wave (PAW) method[49,50] for describing the interaction between core electrons and valence electrons. All calculations were run with an energy cut-off of 280 eV, normal precision, Methfessel-Paxton smearing, and accounting for spin polarization. The Brillouin zone was sampled with a 9×9×1 Monkhorst-Pack grid. The experimentally reported crystal structure of CoPS consists of S and P disordered lattice (a=5.422 Å, ICSD collection code #62414)[30]. A simple model of CoPS was obtained by substituting each dumbbell within the unit cell with P and S atoms and adjusting the lattice constant to match the experimental value of CoPS. Chemisorption was modeled on the $CoS_2$ (a=5.5388 Å, ICSD collection code #86351) and CoPS {100} surfaces, while ensuring a stable surface termination where the dichalcogenide dumbbells remain intact. The resulting slab model consists of four layers, separated by an approximately 10 Å vacuum gap. For the resulting surface unit cell, adsorption of a single H atom onto Co corresponds to half coverage. Chemisorption energies of atomic hydrogen were calculated relative to $H_2(g)$ by:

$$\Delta E = E(\text{surf}+n\text{H}) - (E(\text{surf}) + \frac{1}{2}E(H_2))$$

All structures were relaxed to a tolerance of less than 0.1 eV/Å. The associated free energy of chemisorption was then calculated by correcting for both the zero point vibrational energy and the loss of translation entropy of $H_2(g)$ upon adsorption, and neglecting the smaller vibrational entropy terms. The zero point contributions for $CoS_2$ and CoPS are essentially identical, yielding $\Delta G = \Delta E + 0.29$ eV.

Synthesis of Cobalt Precursor Materials.

Co Films.

The Co films were prepared on graphite disk substrates (6.0 mm (d)×1 mm (t), Ultra Carbon Corp., Ultra "F" Purity) and borosilicate glass substrates by electron-beam evaporating 100 nm Co (Kurt J. Lesker, 99.95%) onto the substrate at 1 Å s$^{-1}$ deposition rate.

CHCH Nanowires (NWs).

The graphite substrates were first treated by annealing in air at 800° C. for 10 min to improve the surface hydrophilicity. Then cobalt hydroxide carbonate hydrate (CHCH, $Co(OH)(CO_3)_{0.5} \cdot xH_2O$) NWs were synthesized on these graphite substrates by following a published procedure[10] with minor modifications. In a typical synthesis, 1.5 mmol of $Co(NO_3)_2 \cdot 6H_2O$, 3 mmol $NH_4F$ (Sigma-Aldrich, ≥ 98.0%), and 7.5 mmol $(NH_2)_2CO$ (Riedel-de Haën, 99.5-100.5%) were dissolved in 50 mL of distilled water. Then, 16 mL of this solution was transferred to a 23-mL PTFE-lined stainless steel autoclave containing the graphite substrate, which was sealed and heated at 110° C. for 5 h. After cooling, the substrate was removed, rinsed with ethanol and water, and dried under a stream of nitrogen.

CHCH Nanoplates (NPls). Cobalt hydroxide carbonate hydrate ($Co(OH)(CO_3)_{0.5} \cdot xH_2O$, "CHCH") nanoplates (NPls) were synthesized on carbon fiber paper (Toray Paper 060 from Fuel Cell Earth, Teflon Treated, Thickness 0.19 mm) that has been treated by annealing in air at 800° C. for 10 min to make it hydrophilic. The NPls were synthesized in a two-step process. In the first step, cobalt oxide (CoO) nanoparticles were deposited on the substrate (1 cm×3 cm) following a published procedure[11] with slight modifications. In a typical synthesis, 0.4 g cobalt (II) nitrate hexahydrate and 0.05 g polyvinylpyrrolidone (PVP) were dissolved in 0.55 g dimethylformamide (DMF) under vigorous stirring at 80° C. for 2 h to make an ink. A treated carbon paper substrate was dip-coated in the ink and then dried under a stream of nitrogen. The substrate was then placed in the center of a fused silica tube (1 inch O.D.) heated to 600° C. in a tube furnace (Lindberg/Blue M) at a pressure of 100 mTorr and a 50 sccm argon flow rate. In the second step, the cobalt oxide nanoparticle-coated carbon fiber paper was used as the substrate in the CHCH synthesis described above to result in the formation of NPls instead of NWs.

Synthesis of CoPS Nanostructures.

An alumina boat containing 1 g of a 1:1 mixture of sulfur (Sigma-Aldrich, 99.5-100.5%) and phosphorus (Alfa Aesar, 98.9%) powders was covered with a piece of glass and placed in the center of a fused silica tube reactor equipped with pressure and gas flow controllers and heated in a tube furnace (Lindberg/Blue M). The Co film, CHCH NW and CHCH NPl precursor substrates were placed on an alumina plate (4 mm thick) at the downstream end of the tube, outside of the heating area of the furnace. After the tube was purged with Ar carrier gas (99.999%) at 25 sccm and 780 Torr, the furnace was first heated to 200° C. for 10 min, then opened and allowed to cool naturally to make a thiophosphate $(P_xS_y)$ paste-like product in the alumina boat. Then, without opening the tube to atmosphere, by manipulating a magnetic stir bar inside the reactor, the cover was taken off of the alumina thiophosphate precursor boat, the boat was moved to the upstream edge of the furnace, and the cobalt precursor substrates were moved to the center of the furnace. The furnace was then heated to 500° C. for 1 h to covert these precursors to CoPS before the furnace was cooled down naturally.

Synthesis of Films and Nanowires of $CoP_x$, $CoP_x|H_2S$, $CoP_x|S$, $CoS_2|P$ and $CoS_2|P+H_2$ as Comparative Samples.

$CoP_x$ Film and NWs.

The synthesis of highly catalytic $CoP_x$ material with a predominant CoP composition and a minor $CoP_2$ phase was achieved via thermal conversion of 100 nm thick Co film on borosilicate glass or graphite disk and CHCH NWs on graphite disk at 500° C. for 45 min in a phosphorus (0.3 g of red phosphorus in an alumina crucible at ~425-450° C.) and hydrogen gas (25 sccm $H_2$ and 25 sccm argon gas) atmosphere.

$CoP_x|H_2S$ and $CoP_x|S$ Film and NWs.

The $CoP_x|H_2S$ and $CoP_x|S$ film and NW samples were prepared by thermal annealing of $CoP_x$ film and $CoP_x$ NWs on borosilicate glass or graphite disk at 500° C. for 20 min in a sulfur (saturated) or hydrogen sulfide (25 sccm 10% $H_2S$ in helium and 25 sccm argon gas) atmosphere.

$CoS_2|P$ and $CoS_2|P+H_2$ Film and NWs.

The $CoS_2|P$ and $CoS_2|P+H_2$ film or NW samples were prepared by thermal annealing of $CoS_2$ film and $CoS_2$ NWs on borosilicate glass or graphite disk[10] at 500° C. for 20 min in a phosphorus (0.3 g of red phosphorus in an alumina crucible at ~425-450° C.) or phosphorus and hydrogen gas (25 sccm $H_2$ and 25 sccm argon gas) atmosphere.

Structural Characterization.

The as-prepared CoPS film and CoPS NWs on graphite substrates, and CoPS NPls on carbon fiber paper and other comparison samples were characterized using a LEO SUPRA 55 VP field-emission scanning electron microscope (SEM) with energy dispersive spectroscopy (EDS) capabilities, and a Bruker D8 ADVANCE powder X-ray diffractometer (PXRD) using Cu Kα radiation. Note that the PXRD patterns for CoPS film and various other thin film samples were taken using borosilicate glass as substrate. Raman spectra were taken using a Thermo Scientific DXR confocal Raman microscope using a 532 nm excitation laser. High-resolution XPS measurements for Co 2p were taken using a Thermo Al Kα XPS with a 180° double focusing hemispherical analyzer and 128-channel detector (60° angular acceptance), which under effective operating conditions had an analyzer resolution of 0.8 eV. All X-ray photoelectron spectra were shifted so that the adventitious carbon C1s peak was at 284.8 eV. S 2p peaks were fitted using doublets with a 1:0.5 (3/2p:1/2p) area ratio, 1.18 eV apart, and with the same full width at half maximum (FWHM). P 2p were fitted using doublets with a 1:0.5 (3/2p:1/2p) area ratio, 0.87 eV apart, and with the same FWHM.

Electrochemical Characterization of Catalytic Activity Toward HER.

All electrochemical measurements were performed in a three-electrode configuration using a rotating disk electrode (RDE) setup (Bioanalytical Systems, Inc.; RDE-2) and recorded using a Bio-Logic SP-200 potentiostat. Each measurement was performed in 0.5 M $H_2SO_4$(aq) electrolyte continuously purged with $H_2$(g) (99.999%) using a saturated $Hg/HgSO_4$ reference electrode (CH Instruments), a graphite rod (National Carbon Co., AGKSP Spectroscopic Electrode) as the counter electrode, and a CoPS film, NW, or NPl or other sample substrate affixed to a glassy carbon RDE tip using silver paint (Ted Pella, PELCO colloidal silver) as the working electrode. Graphite paint (Ted Pella, PELCO isopropanol based graphite paint) was further used to isolate the silver paint contact from the electrolyte solution. Linear sweep voltammograms were measured from open circuit voltage at a scan rate of 2 mV/s, while the working electrode was rotated at 2000 RPM. The $Hg/HgSO_4$ reference electrode was calibrated against the reversible hydrogen potential (RHE) using a platinum wire (Kurt J. Lesker, 99.99%; 0.50 mm diameter) as the working and a platinum mesh as the counter electrodes after each measurement. The Pt reference trace was recorded using a Pt wire as the working electrode. All polarization curves were corrected for iR losses unless otherwise noted. Electrochemical impedance spectroscopy was performed in potentiostatic mode at 0 V vs RHE, applying a sinusoidal voltage with an amplitude of 10 mV and scanning frequency from 250 kHz to 1 mHz.

Fabrication of $n^+$-p-$p^+$ Micropyramid Silicon Substrates Coated with CoPS Films.

Micropyramid silicon arrays were fabricated on both sides of 150 μm-thick p-type (100) Si wafers (dopant concentration of $5\times10^{15}$ $cm^{-3}$) by electrodeless chemical etching in a solution of potassium hydroxide (KOH, 45 vol %) and isopropyl alcohol (IPA). 300 nm of $n^+$ emitter layer (dopant concentration of $9\times10^{19}$ $cm^{-3}$) was formed by the thermal diffusion processes of $POCl_4$ at 1000° C. 300 nm of $p^+$ back surface field layer (dopant concentration of $3\times10^{20}$ $cm^{-3}$) was fabricated by screen printed Al annealed at 500° C. Cobalt films of varying thicknesses were deposited on planar p-type silicon (resistivity of 1-2.5 Ω-cm, B doped, (100) orientation, prime grade, 525 μm thickness) and $n^+$-p-$p^+$ micropyramid silicon substrates by electron-beam evaporating cobalt (Kurt J. Lesker, 99.95%) at 0.1 Å/s deposition rate. Then the cobalt films were converted to CoPS using the procedure described above except that an alumina boat containing 200 mg of 1:1 mixture of sulfur and phosphorus powders was used and, in the last step, the furnace was heated to 450° C. for 10 min.

Photoelectrochemical Characterization.

The photoelectrochemical characteristics were measured in a three-electrode configuration under simulated 1 Sun irradiation (100 mW/$cm^2$) supplied by 1 kW Xe lamp solar simulator (Newport Corp. Model 91191; AM 1.5G filter) using a Bio-Logic SP-200 potentiostat. The light intensity was calibrated with a Si photodiode (Thorlabs) to generate a photocurrent equal to that at 100 mW/$cm^2$ light intensity. All measurements were performed in 0.5 M $H_2SO_4$ electrolyte constantly purged with $H_2$ gas (99.999%), using a graphite rod (National Carbon Co., AGKSP Spectroscopic Electrode) as the counter electrode, and a saturated $Hg/HgSO_4$ reference electrode (CH Instruments). The $Hg/HgSO_4$ reference electrode was calibrated against the reversible hydrogen potential using a platinum wire as the working and a platinum mesh as the counter electrodes after each measurement. The electrolyte was vigorously stirred to minimize mass transport limitations and remove accumulated hydrogen gas bubbles on the electrode surface. The current density vs potential (J-V) curves were measured at a scan rate of 10 mV/s and were not corrected for any uncompensated resistance losses or any other extrinsic losses.

Results and Discussion

Figure 1D:
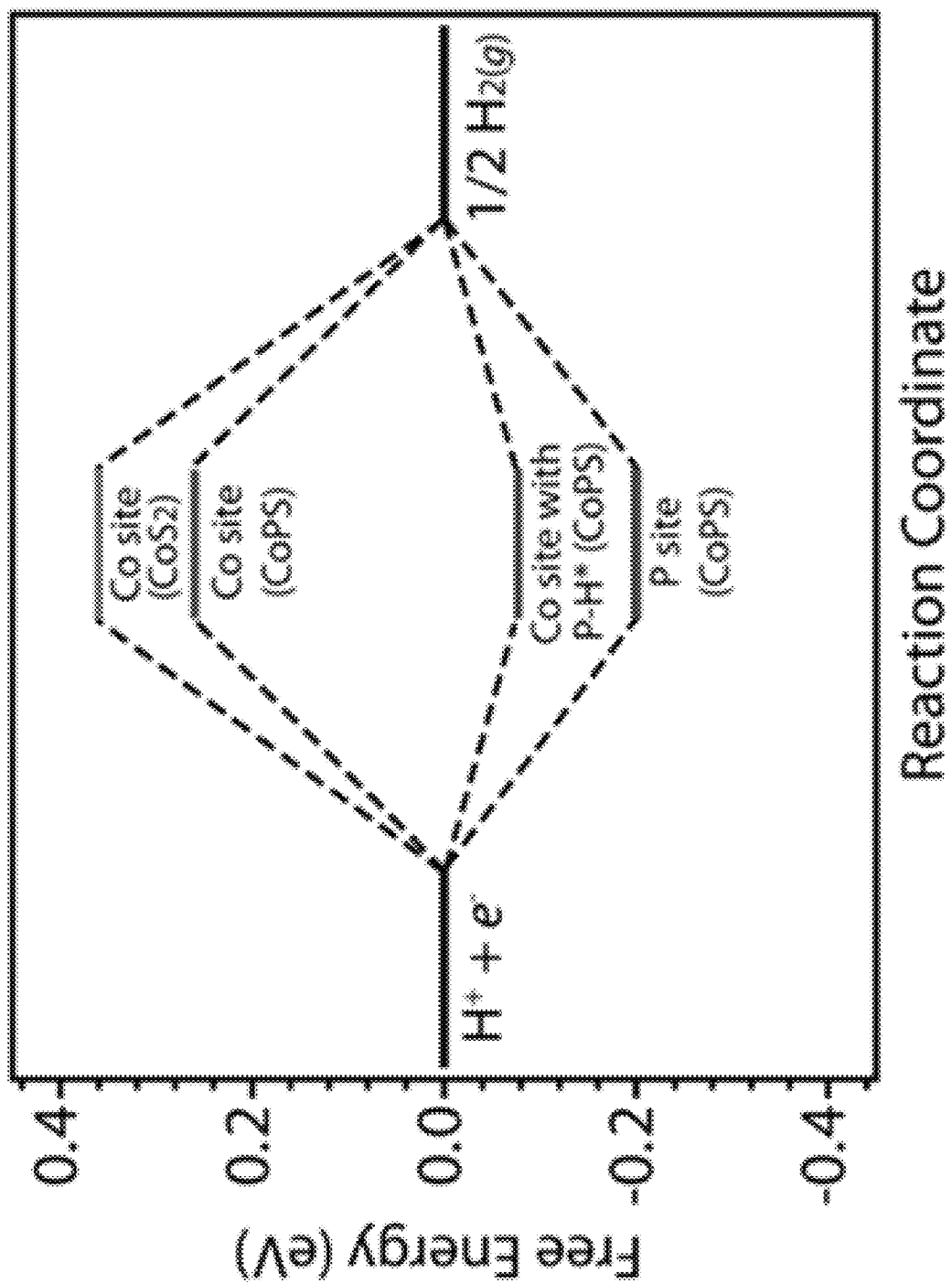

Hydrogen evolution activity has been shown to be strongly correlated with the chemisorption energy of atomic hydrogen to the electrocatalyst surface[31]. Density function theory (DFT) was used to calculate the free energy for atomic hydrogen adsorption ($\Delta G_H^*$) on the {100} surface of CoPS in comparison to $CoS_2$ (see Methods for details), to evaluate whether CoPS is a promising HER catalyst. The main results are shown in FIG. 1d. The $\Delta G_H^*$ for hydrogen adsorption at the Co sites of CoPS is more favorable in comparison to $CoS_2$. Moreover, DFT calculations show that after spontaneous hydrogen adsorption at open P sites (FIG. 1d), the $\Delta G_H^*$ at the adjacent Co sites becomes spontaneous and almost thermoneutral (FIG. 1d), reaching a $\Delta G_H^*$ comparable to that of platinum[31]. This dramatic change in $\Delta G_H^*$ can be attributed to a reduction of $Co^{3+}$ sites to $Co^{2+}$ upon hydrogen adsorption at an adjacent open P site, which then enables the oxidation of $Co^{2+}$ sites back to $Co^{3+}$ upon subsequent hydrogen adsorption. An analogous change in the $\Delta G_H^*$ for $CoS_2$ was not observed since adsorption at Co sites was found to be more favorable than open S sites. Therefore, DFT calculations support the concept of CoPS as a very promising earth-abundant HER catalyst.

Figures 2A, 2B, 2C, 2D:
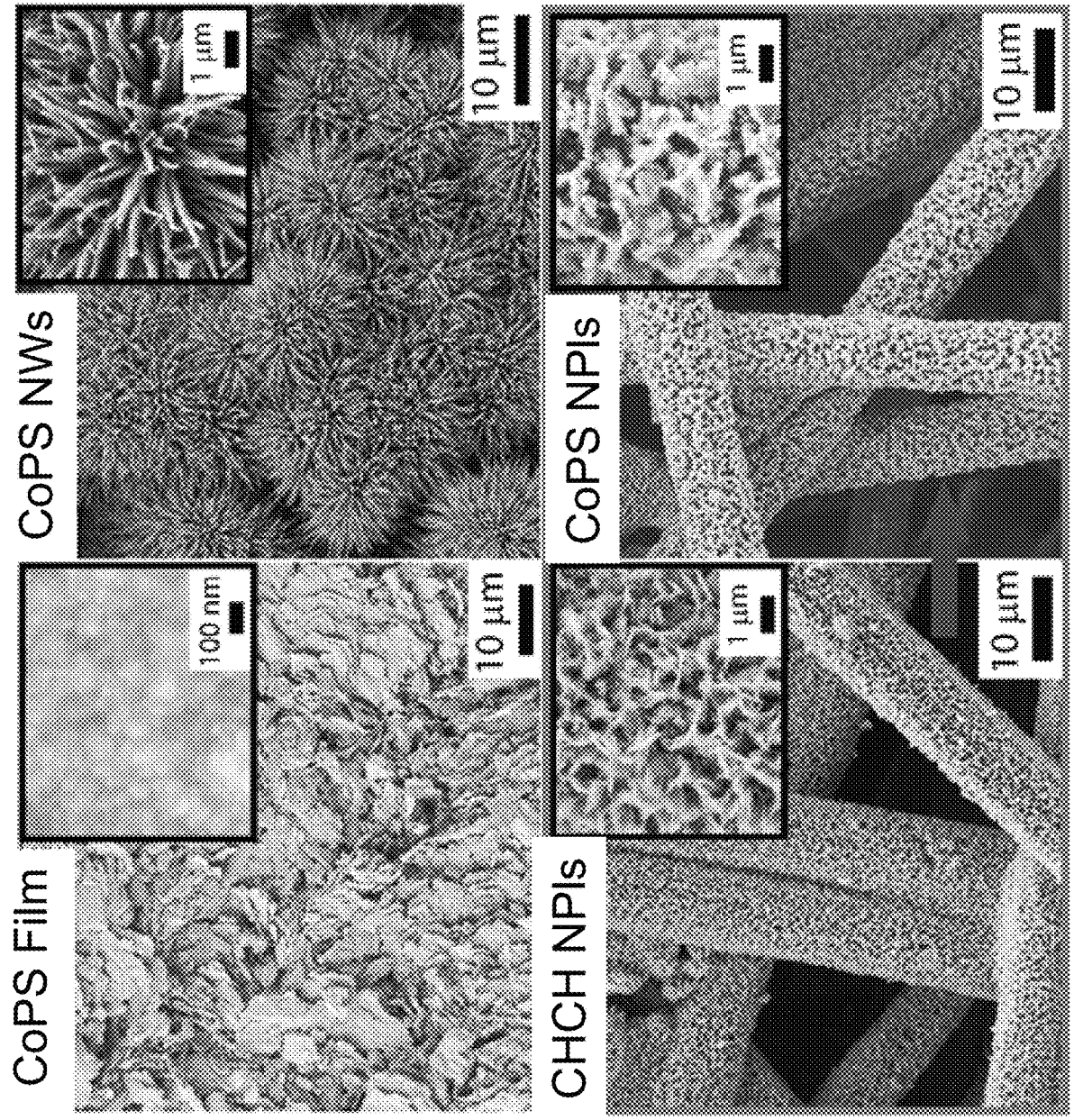
FIGS. 2a-2g illustrate the structural characterization of the CoPS nanostructures. Included are SEM images of as-synthesized (FIG. 2a) CoPS film and (FIG. 2b) CoPS NWs on graphite, and CHCH NPls on carbon fiber paper (FIG. 2c) before and (FIG. 2d) after thermal conversion into CoPS NPls.

CoPS electrodes were synthesized through conversion of cobalt-based nanostructured precursor materials at 500° C. in a thiophosphate ($P_xS_y$) atmosphere produced by the thermal evaporation of a 1:1 stoichiometric mixture of phosphorus and sulfur elemental powders under an argon atmosphere (see Methods for detail). The homogenous reaction with both phosphorus and sulfur was optimized by melting the elemental powder mixture in a crucible first at 200° C. for 5-10 min under argon atmosphere and then carrying out the thermal conversion right away with pre-loaded cobalt precursors without air exposure to the highly hydroscopic paste-like $P_xS_y$. CoPS films and CoPS nanowires (NWs) were synthesized using thermally evaporated 100 nm thick cobalt films and hydrothermally grown cobalt hydroxide carbonate hydrate [CHCH, CO(OH)(CO3) 0.5.xH2O] NWs[32] as precursor materials on graphite disk substrates. Graphite was used as a convenient conductive substrate, however, CoPS films and CoPS NWs can be synthesized on other substrates compatible with the thermal conversion conditions (such as borosilicate glass). Scanning electron microscopy (SEM) (FIG. 2a) shows the polycrystalline CoPS film with particle sizes of roughly 5 nm (FIG. 2a, inset) obtained upon conversion of 100 nm thick cobalt film on graphite. The flake-like appearance of the CoPS film is due to the native roughness of the graphite substrate, which was purposely used to enhance the mechanical stability and surface area of CoPS film. Conversion of the CHCH NWs at 500° C. results in CoPS NWs with identical morphology, but with a polycrystalline structure and similar particle size to CoPS film samples (FIG. 2b). High surface area CoPS nanoplates (NPls) were converted from CHCH NPls grown on carbon fiber paper substrate (FIG. 2c, 2d). The CHCH NPls were synthesized using the same procedures for CHCH NWs[32], but using carbon paper substrates that were precoated with cobalt oxide (CoO) nanoparticles (see Methods for detail)[11]. FIG. 2c shows that the CHCH NPls thoroughly and uniformly cover the carbon fibers and efficiently utilize the high surface area of the carbon paper. Similar to the case of CoPS NWs, thermal conversion at 500° C. results in polycrystalline CoPS NPls (FIG. 2d).

Figure 2E:
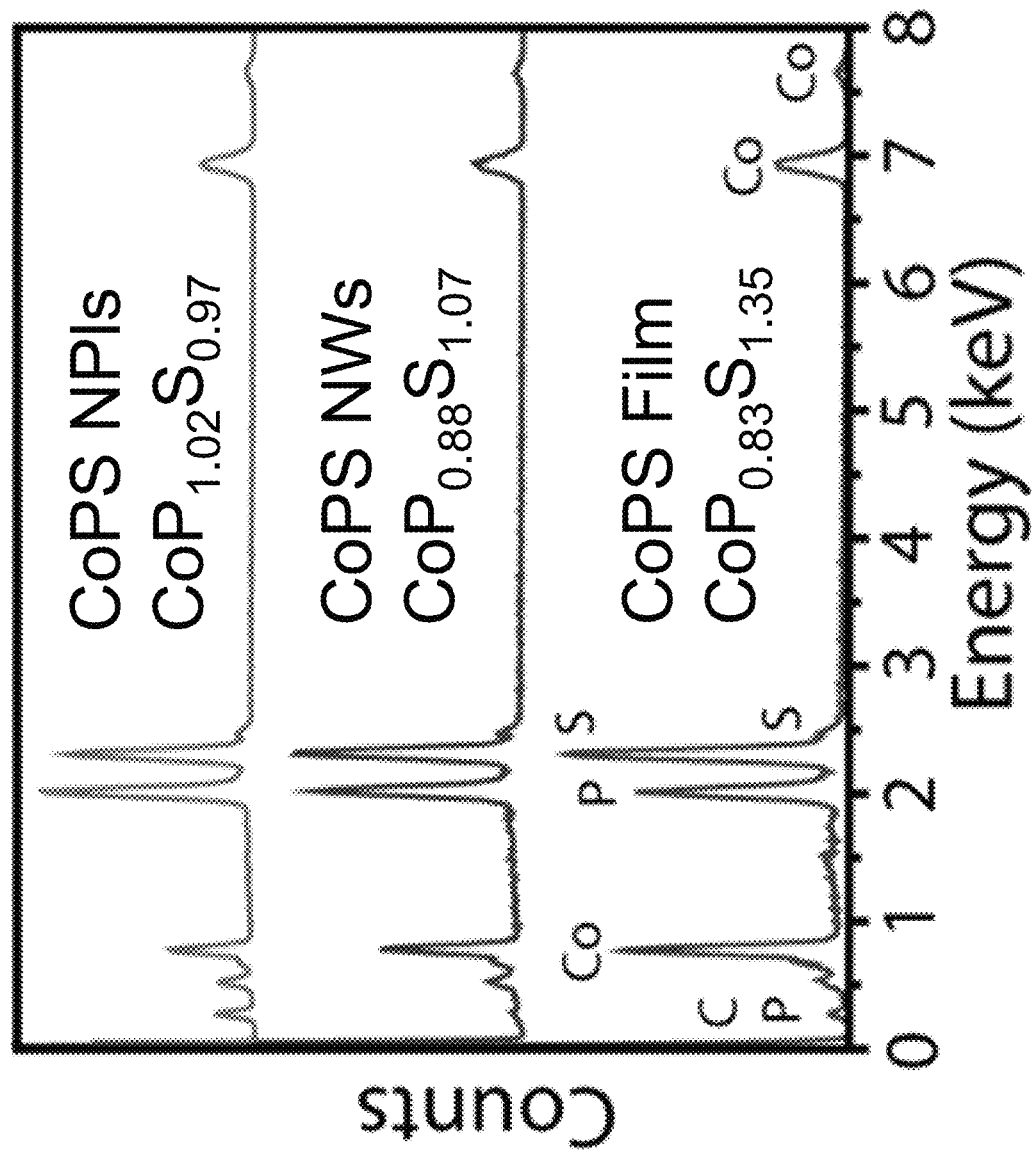
Figure 2F:
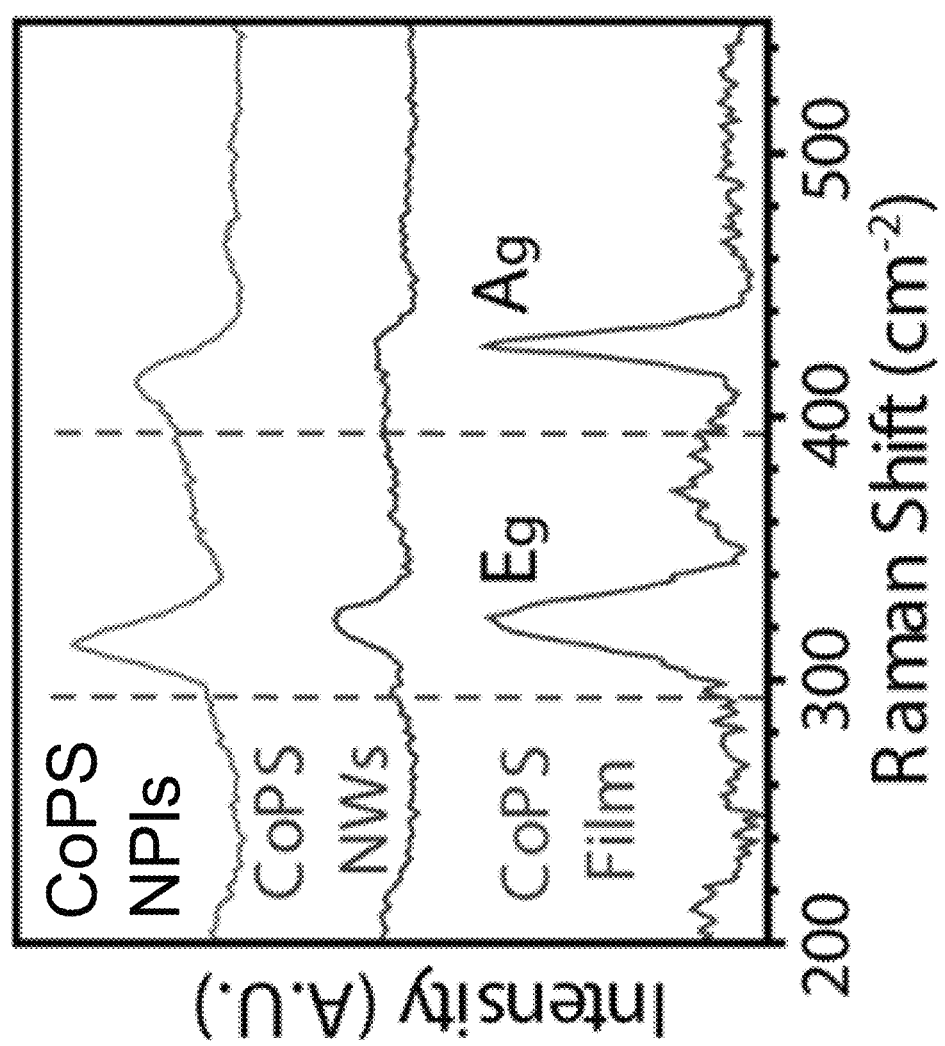
Figure 2G:
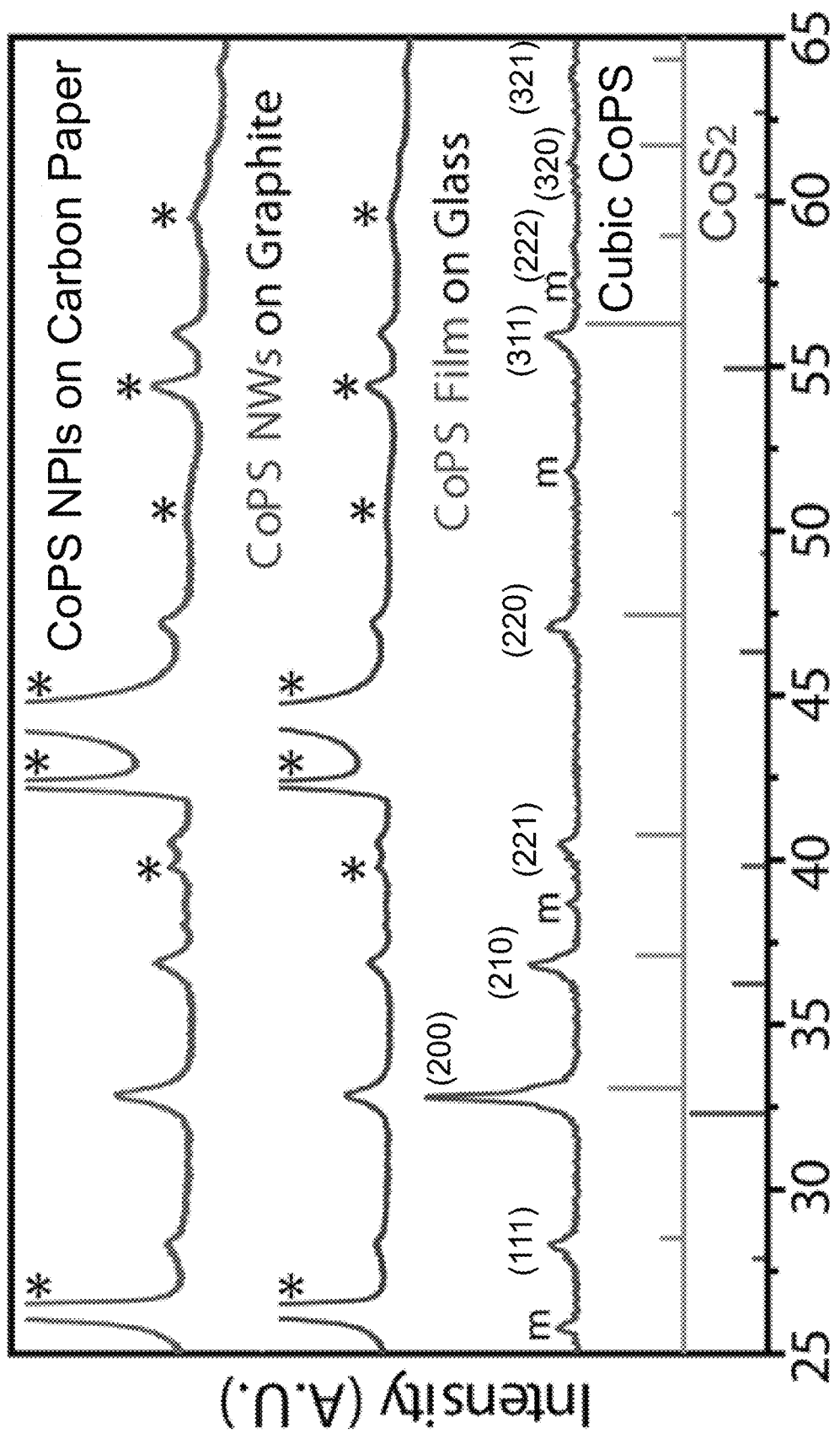

The crystal structure and stoichiometry of these nanostructures were first characterized. Energy dispersive X-ray spectrometry (EDS) revealed the presence of cobalt, phosphorus, and sulfur in elemental compositions of $CoP_{0.83}S_{1.35}$, $CoP_{0.88}S_{1.07}$, and $CoP_{1.02}S_{0.97}$, respectively, for the CoPS film, CoPS NW, and CoPS NPl electrodes (FIG. 2e). The apparent better stoichiometry of CoPS NPls can be attributed to the presence of excess thiophosphates ($P_xS_y$), which will be evident from the discussion of the powder X-ray diffraction (PXRD) patterns. Confocal micro-Raman spectra (FIG. 2f) show two peaks at ~322 $cm^{-1}$ and 427 $cm^{-1}$ for all CoPS samples. These Raman peaks correspond to the characteristic active modes of libration ($E_g$) and in-phase stretch ($A_g$) for the chalcogenide dumbbells in a pyrite crystal lattice. In comparison to the peaks for $CoS_2$ (vertical dash lines in FIG. 2f), the Raman peaks for CoPS electrodes are blue-shifted which can be attributed to the smaller unit cell of CoPS. The presence of only one set of $E_g$ and $A_g$ peaks suggest a ternary CoPS compound rather than a mixture of two solid phases. In contrast, two sets of Raman peaks corresponding to CoPS and $CoS_2$ were observed when unsuccessful thermal conversion was carried out using a 1:3 phosphorus to sulfur ratio (data not shown)[33], which further supports that the obtained CoPS products are indeed a distinctive ternary alloy phase. X-ray photoelectron spectroscopy (XPS) measurements showed an absence of multiplet splitting of the cobalt 2p peak for CoPS film in comparison to $CoS_2$ film (data not shown), which indicates a spin paired electronic configuration for cobalt and an oxidation state of $Co^{3+}$ in $CoPS^{34,35}$. Therefore, XPS also supports that the obtained CoPS products are indeed a distinctive ternary alloy phase. The PXRD patterns (FIG. 2g) of the film, NWs and NPls can be indexed to phosphorus-deficient pyrite-type CoPS phase, since the diffraction peaks match the simulated pattern for cubic CoPS (space group Pa-3, a=5.422 Å, ICSD collection code #62414), but are very slightly shifted toward the standard pattern of $CoS_2$ (a=5.538 Å, JCPDS #41-1471). Refinement of the lattice parameter revealed a lattice constant of a=5.44 Å, which suggests a stoichiometry of ~$CoP_{0.84}S_{1.16}$ based on Vegard's law. The PXRD patterns for CoPS film and NWs are in agreement with the phosphorus deficiency suggested by the EDS spectra, while the PXRD pattern for CoPS NPls indicates that its apparent EDS stoichiometry can be attributed to the presence of excess $P_xS_y$. Phosphorus deficiencies in CoPS samples could be a result of the preferential formation and stability of sulfur-rich $P_xS_y$[36] precursor species and the different diffusivity of elements at the synthetic temperature of 500° C.

Figure 3D:
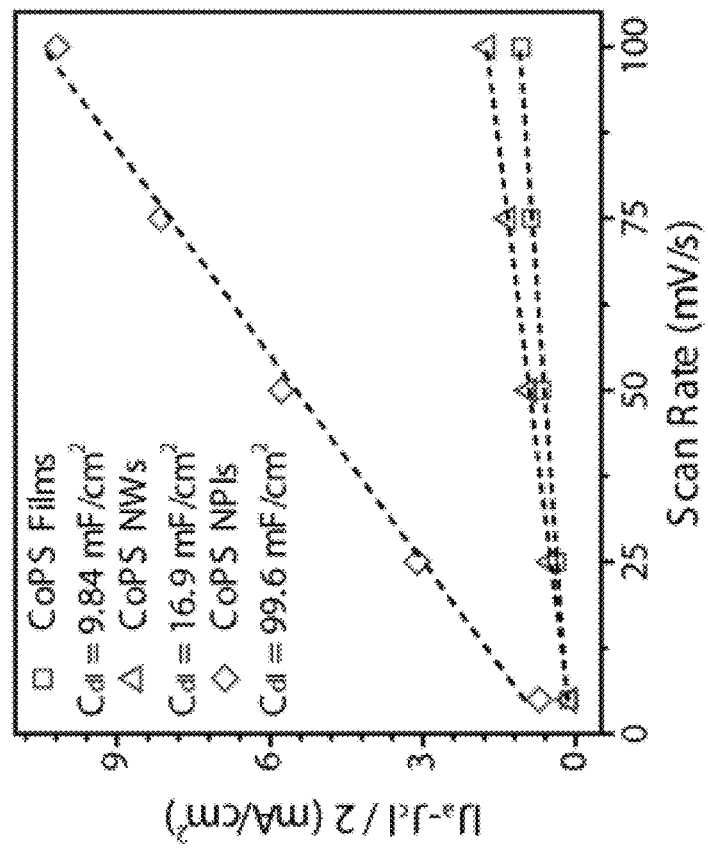
Figure 3C:
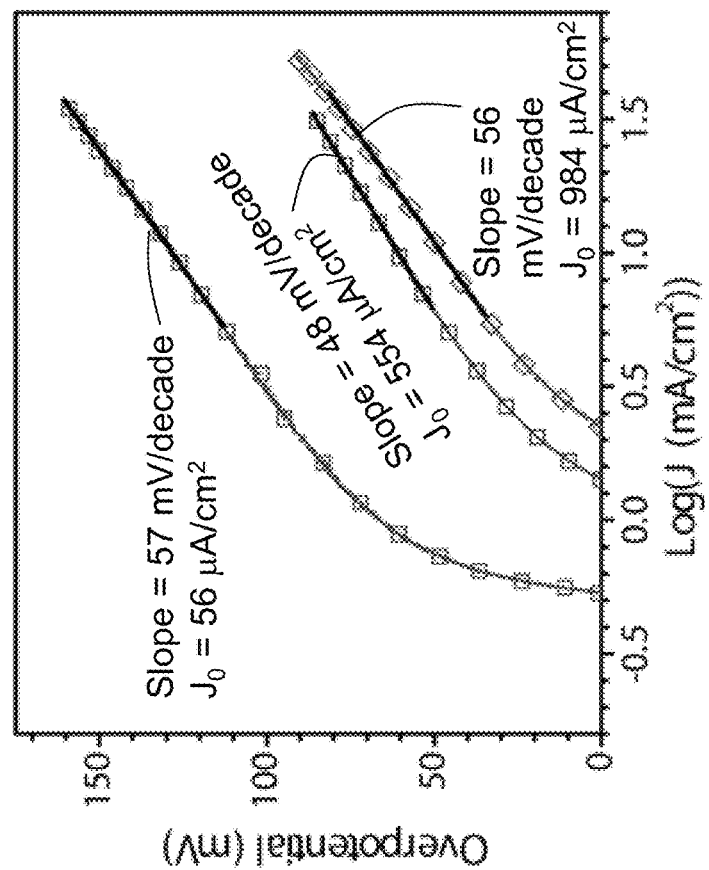

The electrochemical characteristics of the CoPS film, CoPS NW and CoPS NPl electrodes corresponding to the HER catalytic performance were measured using 0.5 M $H_2SO_4$ and rotating disk electrode (RDE) at a rate of 2000 rpm, in comparison to platinum wire (see Methods for detail). FIG. 3a shows that these CoPS electrodes achieved geometric current densities of −10 $mA/cm^2$ at very low overpotentials of −128 mV, −61 mV and −48 mV vs the reversible hydrogen electrode (RHE), respectively. They also exhibited outstanding long-term operation stability beyond 36 h (FIG. 3b) and little change in the film morphology (data not shown). In comparison, high density $CoS_2 NWs^{10}$ on graphite and high surface area $CoSe_2$ nanoparticles on carbon fiber paper[11] have been reported to achieve −10 $mA/cm^2$ at overpotentials of −145 mV and −180 mV vs RHE. The CoPS electrodes also show lower catalytic overpotential than non-pyrite structure metal phosphides, such as CoP (−75 mV at 10 $mA/cm^2$)[12] and $Ni_2P$ (−115 mV at 10 $mA/cm^2$)[14] suggesting that ternary pyrite structure-type CoPS is an oustanding HER catalyst. From the extrapolation of the linear region of a plot of overpotential vs log J (FIG. 3c), the Tafel slopes of 48, 56, and 57 mV/decade were obtained for CoPS film, NW and NPl electrodes, respectively. Such Tafel slope values suggest a two electron transfer process following a Volmer-Tafel mechanism of bimolecular adsorption and hydrogen evolution (theoretical slope of 45 mV/decade)[31]. From the intercept of the linear region of the Tafel plots, exchange current densities ($J_{0, geometrical}$) of 56 $\mu A/cm^2$, 554 $\mu A/cm^2$, and 984 $\mu A/cm^2$ were obtained for CoPS film, CoPS NWs and CoPS NPls electrodes. The exchange currents for CoPS electrodes are 1-2 orders of magnitude larger than those observed for $CoS_2$[10] and $CoSe_2$[11] materials, which explains the better HER catalytic performance of CoPS. Furthermore, films and NWs of CoP with minor $CoP_2$ phase impurity ($CoP_x$), $CoP_x|S$, $CoP_x|H_2S$, $CoS_2|P$ and $CoS_2|P+H_2$ were prepared (see Methods for details) and PXRD and XPS characterization was carried out (data not shown). HER electrochemical measurements were also conducted (data not shown) in comparison with the CoPS samples. Table 2 provides a summary of the electrochemical properties of $CoP_x$, $CoP_x|H_2S$, $CoP_x|S$, $CoS_2|P$ and $CoS_2|P+H_2$ electrodes in comparison with CoPS electrodes. These experiments unequivocally demonstrate that the catalytic HER performance of CoPS electrodes can be attributed exclusively to this ternary pyrite structure-type compound, instead of potential cobalt phosphide impurities or anion substituted doping on the surface of CoPS. Therefore, these CoPS nanostructures are the most catalytically active pyrite-type materials and among the very best earth-abudant catalysts[4] that have been reported to date for HER catalysis.

Figure 3F:
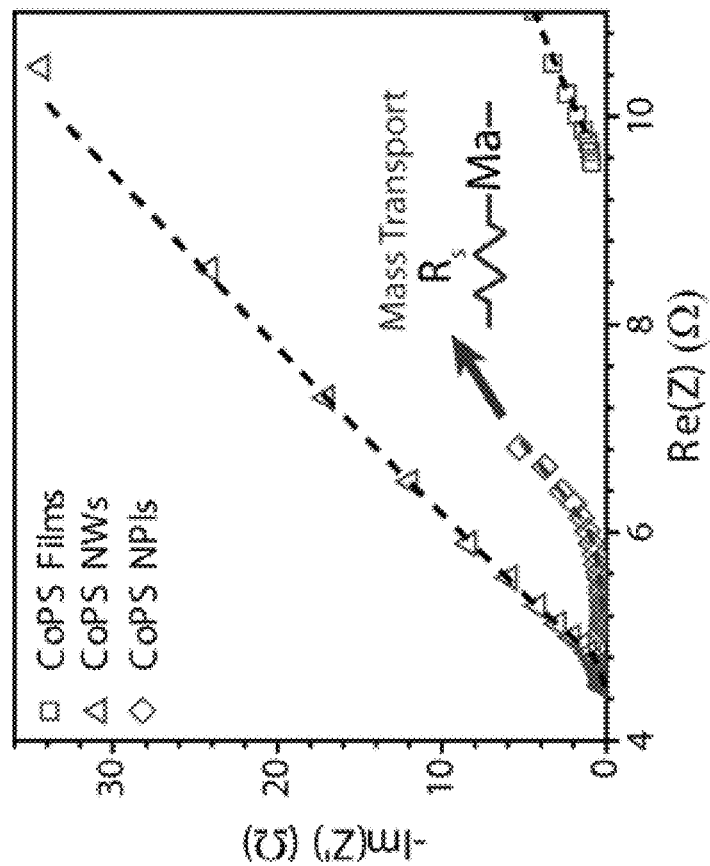
Figure 3E:
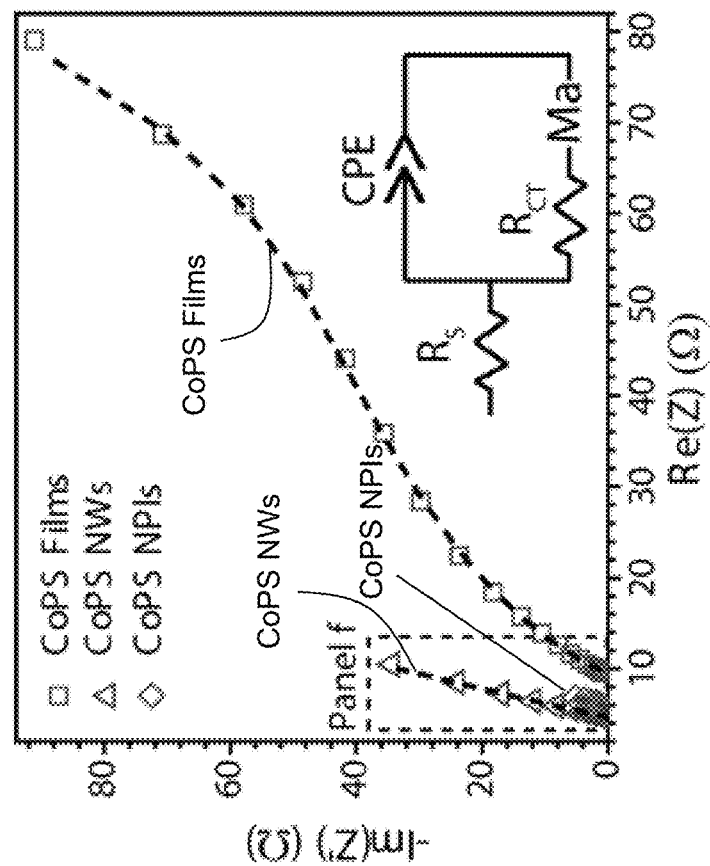

To understand the origin of the differences in the overall catalytic performance among CoPS electrodes, their relative electrochemically active surface areas were estimated using cyclic voltammetry measurements by extracting the double layer capacitance (Cal) (FIG. 3d)[10]. The geometrical exchange current densities were then normalized to compare HER performance relative to the electrochemically active surface area. As shown in Table 1, the relative surface areas for CoPS NWs and CoPS NPls are 1.71 and 10.1 times larger than CoPS film, respectively. The normalized exchange current ($J_{0, normalized}$) for CoPS NW electrode is larger than the $J_{0, normalized}$ for CoPS film (data not shown), indicating that the higher catalytic activity of CoPS NWs can be mainly attributed to the larger surface area. On the other hand, the $J_{0, normalized}$ of CoPS NPls is smaller than that of CoPS film despite a surface area ~10 times larger and similar Tafel slope, which suggests a reduction in the turnover rate per active site. This is likely caused by a mass-transport limited[37] HER catalytic activity for CoPS NPls at a RDE rate of 2000 rpm. Circuit model fitting analysis of the electrochemical impedance spectroscopy (EIS) for the CoPS film and CoPS NWs (FIG. 3e) shows that both electrodes can be modeled using a modified Randles circuit consisting of a series resistance (Rs), constant phase element (CPE), charge transfer resistance ($R_{CT}$), and modified mass-transport impedance element (Ma). In contrast, the EIS of the CoPS NPls (FIG. 30 can be fitted using just Rs and Ma, which is indicative of mass transport control caused by a negligible charge transfer resistance and a very high surface area. Qualitatively, it was observed that the semicircular arc corresponding to CPE and $R_{CT}$ impedance elements seen for the CoPS film significantly decreases for CoPS NWs and completely disappears for CoPS NPls. Also observed was a significant reduction in the overall impedance following the same trend. All of these indicate that the $R_{CT}$ decreases with increasing surface area. The moderate increase in HER catalytic performance seen in the CoPS NPl electrode in comparison to the CoPS film electrode despite a much larger surface area can be explained by a mass-transport limited HER performance for the CoPS NPls. In other words, the HER catalytic reaction is so efficient such that the diffusion of $H^+$ ions cannot keep up with the reaction over the large surface area of CoPS NPl electrode, leading to a reduction in the exchange current per surface area or active site, which benefits the long-term operation stability. Therefore, CoPS NPls represent an upper bound for the effects of surface area on enhancing the overall electrocatalytic performance of CoPS.

Given the high electrocatalytic activity of CoPS toward HER, CoPS as a catalyst together with p-type silicon photocathodes was further studied for solar-driven hydrogen production. The direct integration of catalysts with homogenously doped semiconductors places strong requirements for the intrinsic electronic and optical properties of the catalyst[20]. For example, a high absorption coefficient and a very anodic surface work function for a catalyst can affect the light absorption and band bending of the semiconductor. Therefore, in the fabrication of CoPS electrocatalysts and silicon cathodes for PEC HER, the interfacial properties and CoPS layer thickness must be considered. CoPS/p-Si photocathodes were first fabricated by thermal conversion of a 10 nm cobalt film evaporated on planar p-type silicon. However, the J-V curve of CoPS/p-Si (FIG. 4a) shows no photoresponse and characteristics similar to those of CoPS electrodes. Such J-V characteristics suggest the formation of an ohmic junction, which can be attributed to an accumulation band bending induced by the work function of CoPS or the formation of interfacial defect states.

Figure 4A:
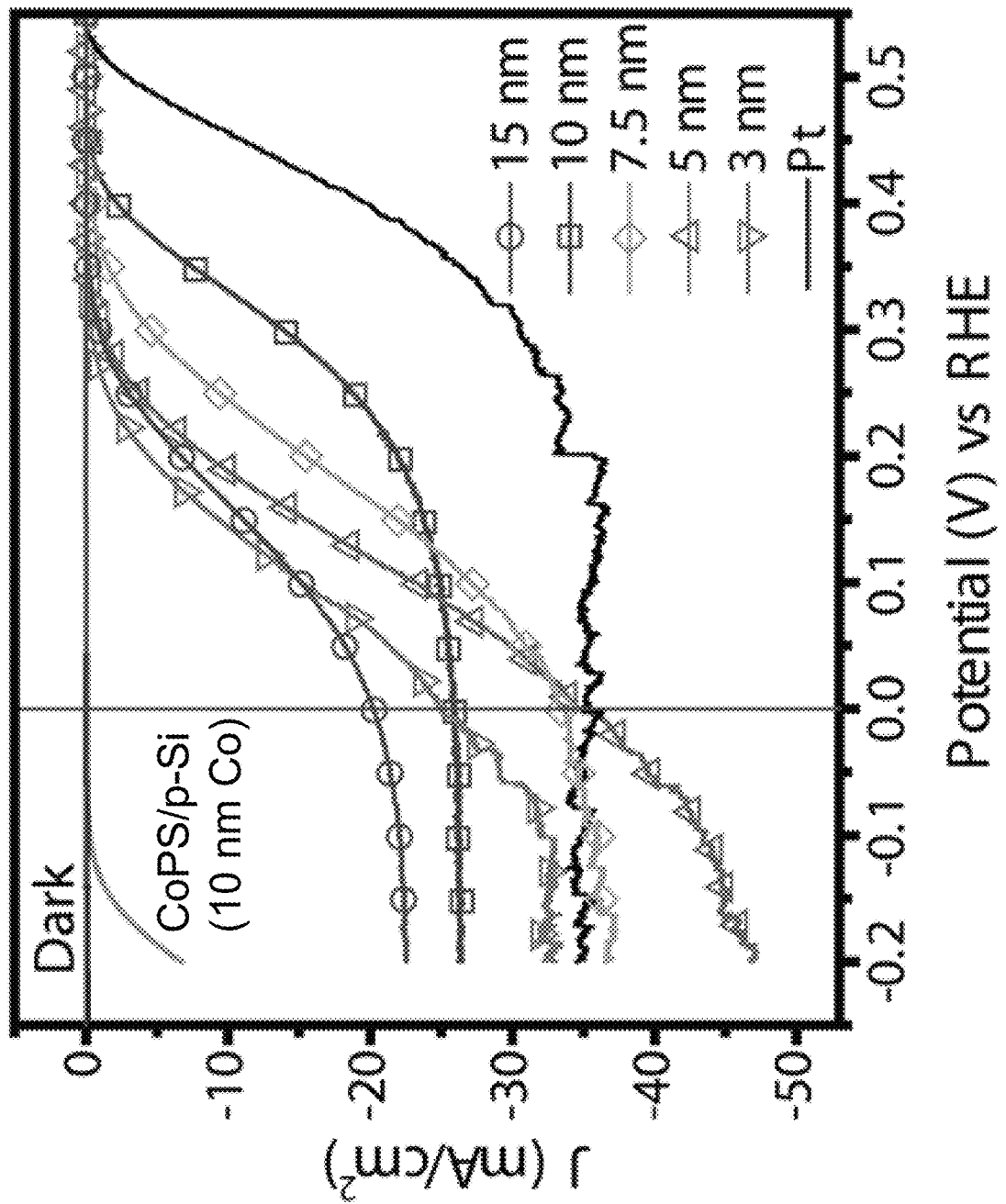

To eliminate the influence of the CoPS catalyst layer on the silicon band bending, the surface of p-type silicon was doped degenerately n-type ($n^+$) to obtain an optimized and "fixed" surface depletion region[38]. The surface of the $n^+$-p-silicon substrate was further nanostructured into micropyramids to enhance light harvesting[39,40]. Furthermore, the back of the silicon substrates was doped degenerately p-type ($p^+$) to improve the majority carrier collection. FIG. 4b, 4c show a top-down and cross-section view of a CoPS/$n^+$-p-$p^+$ micropyramid silicon photocathode prepared by thermal conversion of an evaporated 10 nm thick cobalt film at 450° C. The PEC J-V curves of various CoPS/$n^+$-p-$p^+$-Si photocathodes with different initial cobalt thicknesses (FIG. 4a) show the highest catalytic onset potential due to CoPS. The best CoPS/$n^+$-p-$p^+$-Si photocathode, which was prepared by thermal conversion of a 10 nm cobalt film, achieved a photocurrent density of 0.5 mA/cm$^2$ at a potential of 440 mV vs RHE, a $J_{SC}$ of 26 mA/cm$^2$, and a fill factor of 40%. This corresponds to an overall Faradaic solar-to-hydrogen production efficiency of 4.7%. These are the highest photovoltage onset and efficiency reported so far for any earth-abundant catalyst directly integrated with p-silicon[41-43] or $n^+$-p silicon[44,45]. In comparison, 5 nm Pt/$n^+$-p-$p^+$-Si photocathode achieved 0.5 mA/cm$^2$ at a potential of 530 mV vs RHE and a $J_{SC}$ of 36 mA/cm$^2$. The difference in onset voltage of ~80 mV can be attributed to the difference in catalytic activity between CoPS and Pt, while the lower $J_{SC}$ suggests that part of the incoming light was blocked by the CoPS catalyst layer. An optical absorbance spectrum of such a CoPS layer was obtained (data not shown). When the thickness of the cobalt precursor film was reduced to 7.5 and 5 nm, the $J_{SC}$ of the photocathode increased to ~33-35 mA/cm$^2$. However, the onset voltage also decreased, which suggests a higher light intensity reaching the semiconductor but a less complete CoPS catalyst coverage. On the other hand, when a 15 nm cobalt layer was used as precursor, both the $J_{SC}$ and onset voltage decreased while the rectifying behavior was preserved, suggesting that much less light reached the semiconductor due to an increased light absorption from the thicker CoPS film. These trends clearly show that optimization of the catalyst thickness and coverage is important to balancing the light absorption and catalytic performance to maximize the PEC performance[20,42].

A further description of the supplementary data obtained, but not shown, is provided below.

XPS measurements of Co 2p, P 2p and S 2p for CoP in comparison to CoPS and CoS$_2$ demonstrated that all the surface chemical species for CoPS are different from CoP$_x$ and CoS$_2$. For CoP$_x$, main peaks and minor peaks corresponded to bulk CoP and surface CoP$_2$ layer. These XPS results clearly show that the surface of CoPS catalyst does not contain minor CoP or CoP$_2$ chemical species.

Powder X-ray diffraction (PXRD) patterns for CoP$_x$, CoP$_x$|H$_2$S and CoP$_x$|S were obtained in comparison with the standard patterns for CoP (Pnma, a=5.076 Å, b=3.277 Å, c=5.599 Å, JCPDS #65-2593), CoP$_2$ (P2$_1$/c, a=5.61 Å, b=5.591 Å, c=5.643 Å, JCPDS #26-0481) and CoS$_2$ (Pa-3, a=5.538 Å, JCPDS #41-1471). All PXRD peaks for CoP$_x$ and CoP$_x$|H$_2$S can be indexed to CoP and CoP$_2$ phase. On the other hand, PXRD peaks for CoP$_x$|S can be indexed to CoP$_2$ and CoS$_2$ phase.

X-ray photoelectron spectroscopy (XPS) measurements of Co 2p, S 2p and P 2p peaks for CoP$_x$, CoP$_x$|H$_2$S and CoP$_x$|S film on graphite were obtained. In CoP$_x$|S the Co 2p peak fitting is quite complex, however, it was seen by comparison with the XPS measurements described above that the main Co 2p peak supports the presence of CoS$_2$ on the surface. The P 2p peak and S 2p peak for CoP$_x$|S showed a high concentration of metaphosphides and polysulfide species. On the other hand, Co 2p and P 2p species for CoP$_x$|H$_2$S resembled the chemical species for CoP$_x$, but were slightly shifted towards higher binding energies suggestive of doping. CoP$_x$|H$_2$S also showed the absence of polysulfide chemical species for the S 2p peak. Overall, the surface chemical species for CoP$_x$|S or CoP$_x$|H$_2$S does not resemble any chemical species seen for CoPS.

The electrochemical characteristics of the CoP$_x$, CoP$_x$|H$_2$S and CoP$_x$|S film and NW electrodes (on graphite) corresponding to the HER catalytic performance were measured using 0.5 M H$_2$SO$_4$ and rotating disk electrode (RDE) at a rate of 2000 rpm, in comparison to CoPS film and CoPS NWs. Data showed that the HER catalytic performance of CoPS electrodes was superior to CoP$_x$, CoP$_x$|H$_2$S and CoP$_x$|S electrodes for the respective electrode morphology (film or NWs). CoP$_x$|H$_2$S electrodes showed a small improvement in HER catalytic performance in comparison to CoP$_x$ electrodes which can be attributed to anion substitution doping. In contrast, CoP$_x$|S electrodes showed a significant decrease in performance that could be attributed to the presence of CoS$_2$, metaphosphides and polysulfides on the electrode surface. These results for the HER catalytic performance of $CoP_x$, $CoP_x|H_2S$ and $CoP_x|S$ electrodes (summarized in Table 2) demonstrate that the high catalytic activity of CoPS electrodes cannot be explained by a hypothetical presence of CoP-related minor phases. Furthermore, these results demonstrate that the synthetic approach is a unique strategy for preparing ternary-pyrite cobalt phosphosulfide (CoPS) HER catalyst since the synthesis of this ternary compound cannot be achieved through anion substitution doping strategies for $CoP_x$.

Powder PXRD patterns for $CoS_2$, $CoS_2|P$ and $CoS_2|P+H_2$ were obtained in comparison with the standard patterns for CoP (Pnma, a=5.076 Å, b=3.277 Å, c=5.599 Å, JCPDS #65-2593), $CoP_2$ (P2$_1$/c, a=5.61 Å, b=5.591 Å, c=5.643 Å, JCPDS #26-0481), $Co_{1-x}S$ (P6$_3$/mmc, a=3.38 Å, b=3.38 Å, c=5.185 Å, JCPDS #42-0826) and $CoS_2$ (Pa-3, a=5.538 Å, JCPDS #41-1471). The PXRD pattern for $CoS_2|P$ showed mostly $CoS_2$ diffraction peaks. While the PXRD pattern for $CoS_2|P+H_2$ showed mostly $CoS_2$, and some minor $Co_{1-x}S$ and CoP diffraction peaks.

XPS measurements of Co 2p, S 2p and P 2p for $CoS_2|P$ and $CoS_2|P+H_2$ film on graphite were obtained in comparison with CoPS. In $CoS_2|P$, the Co 2p and P 2p peaks resembled $CoP_x$, but the P 2p peak showed a high concentration of metaphosphides. The bulk S 2p species for $CoS_2|P$ were significantly shifted towards lower binding energy in comparison to $CoS_2$. On the other hand, Co 2p, P 2p and S 2p species for $CoS_2|P+H_2$ suggested the formation of a surface CoP layer, primarily due to the similarities between the main P 2p species for $CoS_2|P+H_2$ and the minor P 2p species for $CoP_x$. Overall, the surface chemical species for $CoS_2|P$ and $CoS_2|P+H_2$ did not resemble those seen for the ternary compound CoPS.

The electrochemical characteristics of the $CoS_2|P+H_2$ and $CoS_2|P$ film and NW electrodes (on graphite) corresponding to the HER catalytic performance were measured using 0.5 M $H_2SO_4$ and rotating disk electrode (RDE) at a rate of 2000 rpm, in comparison with CoPS film and CoPS NWs. Data showed that the HER catalytic performance of CoPS electrodes was superior to $CoS_2|P+H_2$ and $CoS_2|P$ electrodes for the respective electrode morphology (film or NWs). $CoS_2|P+H_2$ electrodes showed HER catalytic performance very similar to the CoP electrodes which can be attributed to the presence of CoP phases at the surface. In contrast, $CoS_2|P$ electrodes showed significantly lower HER catalytic performance in comparison to $CoS_2|P+H_2$ electrodes, which can be attributed to the high concentration of metaphosphides on the electrode surface. These results for the HER catalytic performance of $CoS_2|P+H_2$ and $CoS_2|P$ electrodes (summarized in Table 2) also indicate that the high catalytic activity of CoPS electrodes cannot be explained by a hypothetical presence of CoP-related minor phases. Furthermore, these results demonstrate that the synthetic approach is a unique strategy for preparing the outstanding ternary-pyrite cobalt phosphosulfide HER catalyst since the synthesis of this ternary compound cannot be achieved readily through anion substitution doping strategies for $CoS_2$.

Conclusion

In conclusion, pyrite-type cobalt phosphosulfide (CoPS) has been shown to be a novel high-performance earth-abundant catalyst for robust electrochemical and solar-driven hydrogen production. The electrocatalytic performance of this novel pyrite-type ternary material can be further enhanced through the synthesis of high surface area CoPS nanowires and nanoplates on conducting graphite or carbon fiber paper substrates using a simple thermal conversion reaction. These CoPS nanostructures achieved stable catalytic performance superior to that reported for metal chalcogenides (especially the parent metal pyrites) and metal phosphides, and are among the most active earth-abundant HER catalysts reported to date. These results illustrate that in addition to a high concentration of available catalytic sites, controlling the hydrogen adsorption energy of the active sites by tuning their electronic structure and reactivity by substituting non-metal atomic constituents in ternary or more complex compounds can serve as a new and general strategy to enhance the electrocatalytic activity of transition metal compounds. Furthermore, CoPS-based photocathodes fabricated by direct growth of CoPS on n$^+$-p-p$^+$ micropyramid silicon achieved competitive performance for solar-driven hydrogen production in comparison to Pt/n$^+$-p-p$^+$-Si photocathodes. The photoelectrochemical studies also show that both the work function and light absorption of the surface catalyst layer in integrated devices are crucial factors for achieving efficient solar-driven hydrogen generation.

TABLE 1

Summary of the electrochemical properties of CoPS electrodes with different morphologies.

| Sample | η (mV vs RHE) for J = −10 mA/cm$^2$ | η (mV vs RHE) for J = −20 mA/cm$^2$ | Rs (Ω cm$^2$) | Tafel slope (mV/decade) | $J_{0,\ geometrical}$ (μA/cm$^2$) | $C_{dl}$ (mF/cm$^2$) | Relative Surface Area | $J_{0,\ normalized}$ (μA/cm$^2$) |
|---|---|---|---|---|---|---|---|---|
| CoPS film | −128 | −145 | 2.64 | 57 | 56 | 9.84 | 1.00 | 56 |
| CoPS NWs | −61 | −75 | 1.30 | 48 | 554 | 16.9 | 1.72 | 90 |
| CoPS NPls | −48 | −65 | 1.42 | 56 | 984 | 99.6 | 10.1 | 38 |

TABLE 2

Summary of the electrochemical properties of $CoP_x$, $CoP_x|H_2S$, $CoP_x|S$, $CoS_2|P$ and $CoS_2|P + H_2$ electrodes in comparison with CoPS electrodes.

| Sample | η (mV vs RHE) for J = −10 mA/cm$^2$ | η (mV vs RHE) for J = −20 mA/cm$^2$ | $R_S$ (Ω cm$^2$) | Tafel slope (mV/decade) | $J_{0,geometrical}$ (μA/cm$^2$) |
|---|---|---|---|---|---|
| CoPS NWs | −61 | −75 | 1.30 | 48 | 554 |
| CoPS film | −128 | −145 | 2.64 | 57 | 56 |

TABLE 2-continued

Summary of the electrochemical properties of $CoP_x$, $CoP_x|H_2S$, $CoP_x|S$, $CoS_2|P$ and $CoS_2|P + H_2$ electrodes in comparison with CoPS electrodes.

| Sample | η (mV vs RHE) for J = −10 mA/cm² | η (mV vs RHE) for J = −20 mA/cm² | $R_S$ (Ω cm²) | Tafel slope (mV/decade) | $J_{0,geometrical}$ (μA/cm²) |
|---|---|---|---|---|---|
| $CoP_x$ NWs | −85 | −102 | 0.92 | 56 | 294 |
| $CoP_x$ Film | −150 | −169 | 1.12 | 63 | 41 |
| CoPx|H₂S NWs | −81 | −96 | 0.90 | 50 | 244 |
| CoPx|H₂S Film | −148 | −165 | 1.17 | 55 | 21 |
| CoPx|S NWs | −136 | −158 | 0.88 | 69 | 105 |
| CoPx|S Film | −202 | −220 | 1.10 | 64 | 7.4 |
| CoS₂|P NWs | −131 | −152 | 1.02 | 72 | 152 |
| CoS₂|P Film | −193 | −214 | 1.18 | 70 | 18 |
| CoS₂|P + H₂ NWs | −87 | −104 | 0.93 | 56 | 273 |
| CoS₂|P + H₂ Film | −143 | −161 | 1.17 | 59 | 37 |

Example 2: Cobalt Phosphoselenide Electrocatalysts

The procedures in Example 1 were followed to synthesize and test pyrite-phase cobalt phosphoselenide, CoPSe. This electrocatalyst was found to achieve an electrocatalytic current density of 10 mA/cm² at an overpotential of 122 mV and a Tafel slope of 64.6 mV/dec.

Example 3: Nickel Phosphoselenide Electrocatalysts

Introduction

In this Example, the synthesis of pyrite-phase nickel phosphoselenides was investigated and a series of $NiP_2$, Se-doped $NiP_2$, P-doped $NiSe_2$, and $NiSe_2$ nanostructures was prepared through thermal conversion of $Ni(OH)_2$ precursor nanostructures in appropriate P and/or Se vapors. This facile synthetic method makes it convenient to systematically compare the structural property and catalytic activity for HER and establish the relationship between synthesis, structure, and catalytic activity. It was found that the doping of $NiP_2$ with Se not only reduced the overpotential, but also decreased the Tafel slope and increased exchange current density, thus significantly improving the HER catalytic performance. Se-doped $NiP_2$ ($NiP_{1.93}Se_{0.07}$) is a highly active and stable electrocatalyst for HER and shows the best performance among the four pyrite-phase compounds, followed by $NiP_2$, P-doped $NiSe_2$ ($NiP_{0.09}Se_{1.91}$), and $NiSe_2$. Se-doped $NiP_2$ ($NiP_{1.93}Se_{0.07}$) grown on carbon fiber paper can achieve a catalytic current density of 10 mA cm⁻² at an overpotential of 84 mV with a Tafel slope of 41 mV decade⁻¹, which establishes $NiP_{1.93}Se_{0.07}$ as a highly-active, earth-abundant, and stable electrocatalyst for the HER.

Methods

All chemicals were purchased from Sigma-Aldrich and used without further purifications unless otherwise noted.

Synthesis of Electrocatalyst Materials.

$Ni(OH)_2$ Nanoflake Precursor.

Nickel hydroxide hydrate ($Ni(OH)_2 \cdot 0.75H_2O$) nanoflakes were synthesized on graphite disks and carbon fiber paper electrodes by modifying a reported procedure for synthesizing cobalt hydroxide nanostructure analogs.[10] 6 mmol of $Ni(NO_3)_2 \cdot 6H_2O$ (≥98.5%), 12 mmol $NH_4F$ (≥98.0%), and 30 mmol $(NH_2)_2CO$ (99.5-100.5%) were dissolved in 200 mL of 18.2 MΩ de-ionized water. 16 mL of the solution was transferred to a 23-mL PTFE-lined stainless steel autoclave containing the substrate leaned against the autoclave wall. After the sealed autoclave was heated at 110° C. for 3 h, it was cooled down. Then the substrate was removed, washed with water and ethanol, and dried in an oven at 80° C. for 20 min.

Graphite Disk Substrate and Carbon Fiber Paper Preparation.

Graphite disk substrates (6.0 mm diameter; ~1 mm thick) were prepared by cutting and mechanically thinning slices of a graphite rod (Ultra Carbon Corp., Ultra "F" Purity). Slices of the graphite rod were polished on both sides with sand paper. The graphite disks were cleaned by sequentially sonicating (100 W) in ethanol and deionized water for 10 min, respectively. Then the clean graphite disks were dried in a forced-air oven at 120° C.

Carbon fiber paper substrates were purchased from Fuel Cell Earth Corp. with a thickness of 0.19 mm. The cut carbon fiber paper was etched by plasma for 10 min at 150 W firstly, then heated to 700° C. for 10 min to make it hydrophilic.

Thermal Conversion.

The graphite or carbon paper substrates covered with the nanoflakes were placed in the center of a fused silica tube in a Lindberg/Blue M tube furnace equipped with both pressure regulators and gas flow controllers. An alumina boat containing a total of 10 mmol of phosphorous (99.5-100.5%) and selenium (99.5-100.5%) powders with varying ratios (pure P, 3:1, 3:2, 3:3, 2:3, pure Se) was placed at the farthest upstream position within the reactor tube. The tube was purged 3 times with Argon and maintained at 780 Torr under a steady flow of Ar carrier gas (99.999%) at 25 sccm. The furnace temperature was ramped to 500° C. and held for 30 min. After cooling under Ar flow, the samples were removed and rinsed with $CS_2$ (99.9%) for 10 min, then washed with ethanol, and dried in a flow of $N_2$ gas.

Structural Characterization.

Scanning electron microscope (SEM) and energy dispersive X-ray spectroscopy (EDS) were performed using a LEO SUPRA 55 VP field-emission SEM with EDS capabilities. The voltages for SEM imaging and EDS mapping were 3 keV and 15 keV, respectively. Raman spectra were collected on a Horiba Jobin Yvon Labram Aramis Confocal Raman microscope with a 532 nm laser and ~16 μm diameter laser spot size. Powder X-ray diffraction (PXRD) data were acquired on a Bruker D8 ADVANCE powder X-ray diffractometer equipped with a Cu Kα source. The transmission electron microscopy (TEM) samples were prepared by immersing and sonicating the samples grown on graphite disk in ethanol for 30 s, and drop-casting the suspension onto Cu TEM grids with lacey carbon support (Ted Pella,

01890-F). TEM images were taken on an FEI Titan aberration-corrected scanning transmission electron microscope operated at an accelerating voltage of 200 kV in TEM mode.

Electrochemical Characterization.

All electrochemical measurements were conducted in a three-electrode setup with a rotating disk electrode (RDE, Bioanalytical Systems, Inc.; RDE-2) using a Bio-Logic SP-200 potentiostat. The measurements were performed in 0.5 M $H_2SO_4$(aq) electrolyte continuously purged with $H_2$(g) (99.999%), with a saturated calomel reference electrode (SCE) (CH Instruments), a graphite rod (National Carbon Co., AGKSP Spectroscopic Electrode) counter electrode, and a graphite disk or carbon fiber paper supported sample affixed to a glassy carbon RDE tip using silver paint (Ted Pella, PELCO Colloidal Silver) as the working electrode. Linear sweep voltammetry (LSV) measurements were performed at a scan rate of 3 mV $s^{-1}$ while rotating the working electrode at 1000 RPM. The SCE was calibrated against the reversible hydrogen potential (RHE) using platinum wire (Kurt J. Lesker, 99.99%; 0.50 mm diameter) as both the working and counter electrodes in 0.5 M $H_2SO_4$ (E (RHE)=E (SCE)+0.268 V). All measurements were corrected for a small ohmic loss (<3.5Ω) determined via impedance spectroscopy. Electrochemical impedance spectroscopy was performed in potentiostatic mode at −0.13 V vs. RHE with an applied sinusoidal voltage with an amplitude of 10 mV and scanning frequency from 200 kHz to 100 mHz. The data were fitted using a simplified Randles equivalent circuit (not shown) to investigate the electrode kinetics. To determine the double-layer capacitance (Cal) for each electrode, two CV cycles were recorded from 100 mV to 200 mV vs. RHE at scan rates of 40, 60, 80, 100, and 120 mV $s^{-1}$. Then, for each scan rate, ΔJ was measured at 150 mV vs. RHE and plotted against the scan rate. These data were then fit to a line, the slope of which is equal to twice the geometric $C_{dl}$.

Figure 5A:
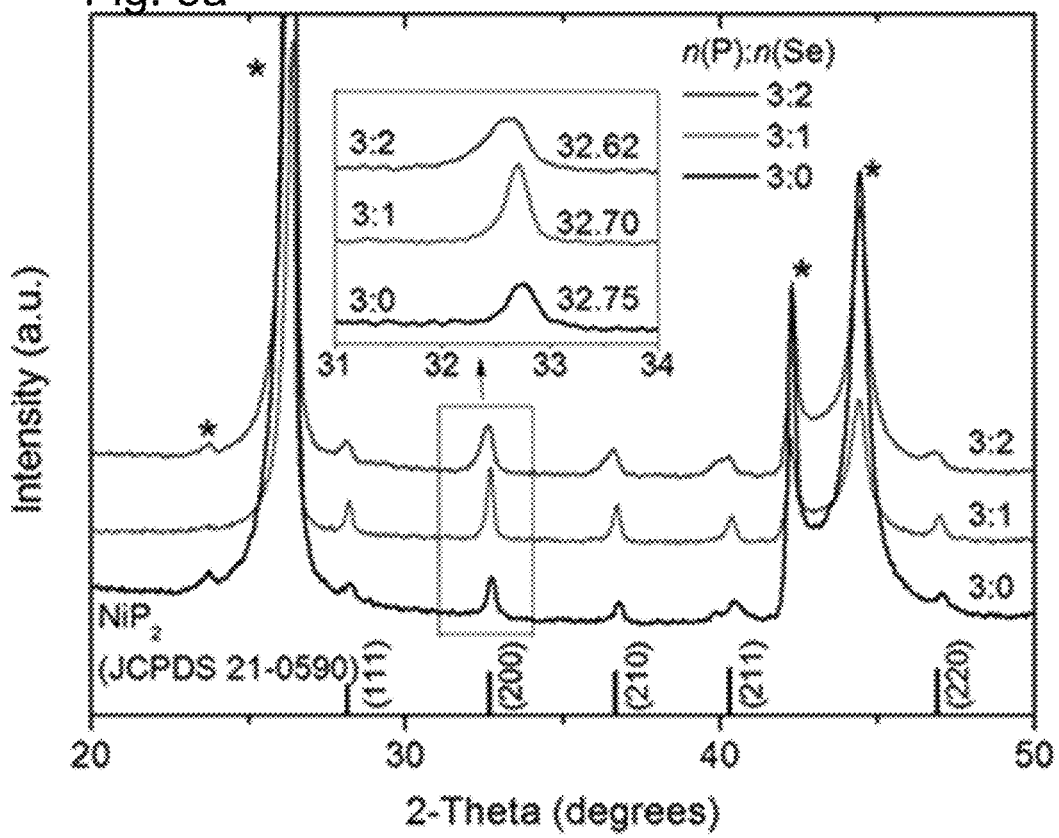
FIGS. 5a-5b show the PXRD patterns of $NiP_2$ and $NiP_{2-x}Se_x$ prepared at n(P):n(Se)=3:2 and 3:1 (FIG. 5a) and $NiSe_2$ and $NiP_xSe_{2-x}$ prepared at n(P):n(Se)=2:3 and 3:3 (FIG. 5b). The stars mark the diffraction peaks from the graphite disk substrate.
Figure 5B:
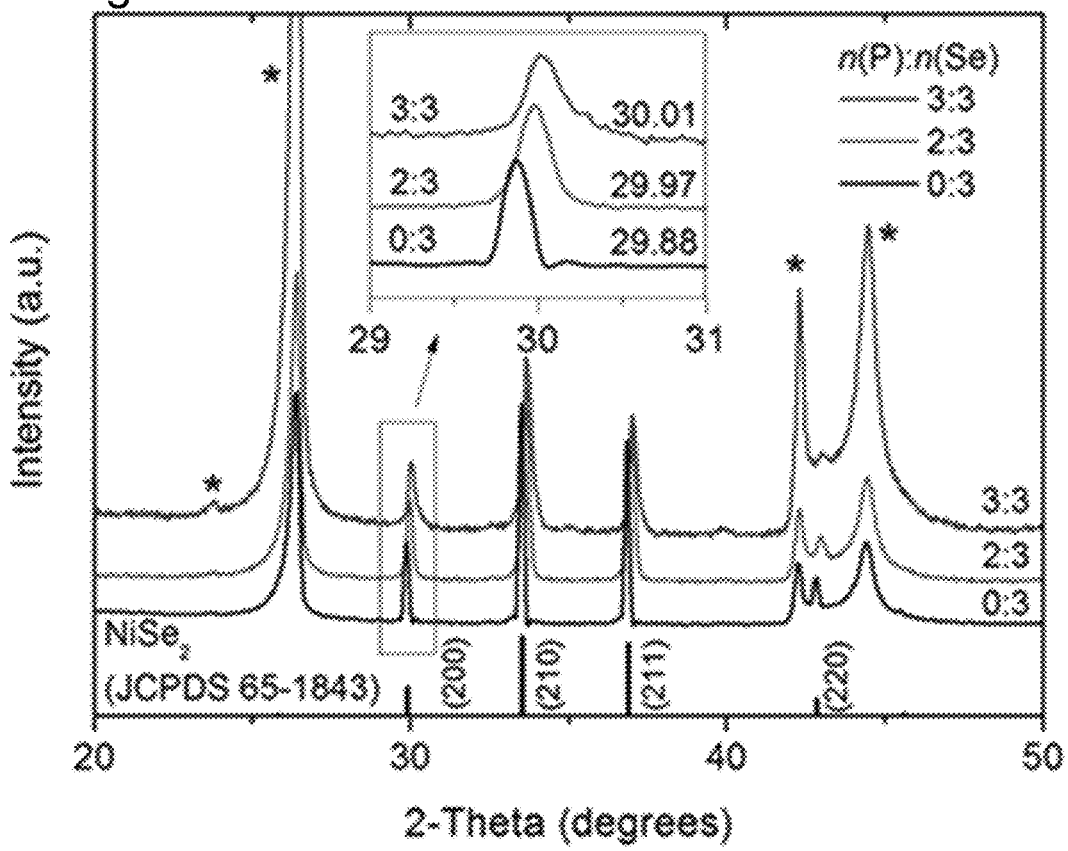

Results and Discussion $NiP_2$, $NiSe_2$, and various $NiP_{2-x}Se_x$ nanostructures were prepared by thermal conversion of precursor $Ni(OH)_2$ nanostructures in different P and Se vapor environments. The precursor $Ni(OH)_2$ nanoflakes (images not shown) were grown directly on conductive graphite disk (or carbon paper) substrates using the solution growth method as described above. Then, a total of 10 mmol of P and Se powders with varying ratios were mixed in a crucible, evaporated in the tube reactor at approximately 250° C., and reacted with the as-prepared $Ni(OH)_2$ nanoflakes at 500° C. for 30 min in Ar atmosphere. FIGS. 5a-5b show the PXRD patterns of the products at different n(P) and n(Se) ratios (3:1, 3:2, 3:3, 2:3) compared with pure $NiP_2$ (3:0) and $NiSe_2$ (0:3) synthesized in pure P or Se environment under the same conditions. Both $NiP_2$ and $NiSe_2$ synthesized under these conditions are the cubic pyrite-structure phase ($NiP_2$, JCPDS 21-0590, space group Pa$\bar{3}$, a=5.471 Å; $NiSe_2$, JCPDS 65-1843, space group Pa$\bar{3}$, a=5.960 Å). The observed peak shifts of the samples converted with mixed precursors when compared with $NiP_2$ and $NiSe_2$ indicate the successful doping of $NiP_2$ with Se or $NiSe_2$ with P that causes the expansion or contraction of the crystal lattice, respectively. It is interesting that when n(P) was larger than n(Se), such as 3:2 and 3:1, $NiP_2$-like compounds ($NiP_{2-x}Se_x$, x is small) were formed (FIG. 5a); when n(Se) was equal or larger than n(P), $NiSe_2$-like compounds were formed (FIG. 5b). For Se-doped $NiP_2$, the peaks shift to smaller 2-θ angles compared with $NiP_2$ (FIG. 5a inset), which suggests the expansion of the crystal lattice caused by the larger radius of Se compared with P. The opposite effect was observed in P-doped $NiSe_2$ when compared with $NiSe_2$ (FIG. 5b inset). Using Vegard's law, the chemical compositions of the samples were calculated based on the observed peak shifts: for the sample prepared with a ratio of n(P):n(Se)=3:2, the composition was $NiP_{1.93}Se_{0.07}$; for the sample prepared with a ratio of n(P):n(Se)=1:1 the composition was $NiP_{0.09}Se_{1.91}$.

The remaining discussion focuses on four representative samples: $NiP_2$, $NiP_{1.93}Se_{0.07}$, $NiP_{0.09}Se_{1.91}$, and $NiSe_2$. Also examined was the influence of the reaction temperature on the conversion for the precursor ratio of n(P):n(Se)=3:2 (SEM images and XRD patterns not shown). At 400° C., the peaks were very weak, which may be caused by the incomplete conversion and poor crystallinity of the product. At 500 and 600° C., there were strong peaks and all of the peaks shifted. However, the variations in the peak shifts from the sample prepared at 600° C. indicated that the conversion at 600° C. was not as consistent. Thus, 500° C. was chosen as the optimized conversion temperature.

Figure 7A:
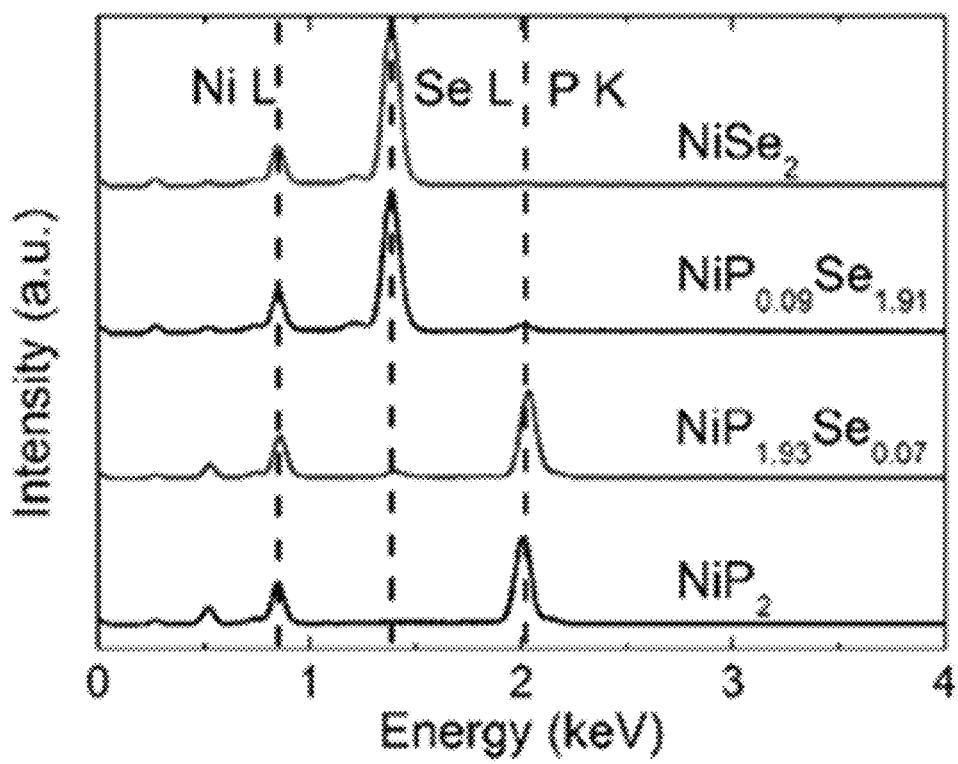
FIGS. 7a-7b show EDS spectra of $NiP_2$, $NiP_{1.93}Se_{0.07}$, $NiP_{0.09}Se_{1.91}$, and $NiSe_2$ samples (FIG. 7a) and Raman spectra of $NiP_2$, $NiP_{1.93}Se_{0.07}$, $NiP_{0.09}Se_{1.91}$, and $NiSe_2$ samples (FIG. 7b).

The morphologies of $NiP_2$, $NiP_{1.93}Se_{0.07}$, $NiP_{0.09}Se_{1.91}$, and $NiSe_2$ were characterized by scanning electron microscope (SEM) and transmission electron microscopy (TEM) as shown in FIGS. 6a-6h. Both $NiP_2$ and $NiP_{1.93}Se_{0.07}$ are flakes comprised of nanoparticles around 10 nm in diameter. In comparison, $NiP_{0.09}Se_{1.91}$ and $NiSe_2$ form larger particles with ~500 nm diameter. The difference in the particle size and morphology between the $NiP_2$ or doped $NiP_2$ and $NiSe_2$ or doped $NiSe_2$ is noticeable, which is likely due to the different crystal growth behaviors during the conversion reactions. The energy dispersive X-ray spectroscopy (EDS) spectra proved the nanoflakes were composed of Ni, P, and Se (FIG. 7a). Also, elemental mapping images showed that the distribution of Ni, P, and Se atoms in the nanoflakes was homogeneous (data not shown), which is consistent with the PXRD result and further confirms the composition.

Figure 7B:
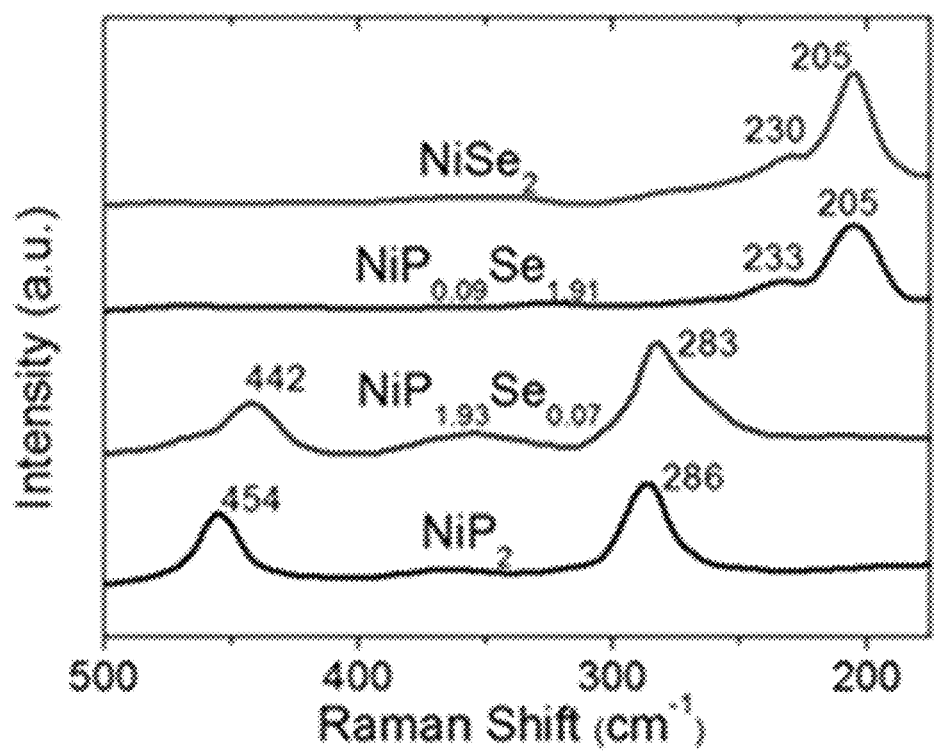

Furthermore, Raman spectroscopy was employed to confirm the formation of pure and doped pyrite-phase products (FIG. 7b). Typical pyrite-structure compounds show two peaks corresponding to $X_2$ (X=S, Se, P) libration ($E_g$) and in-phase stretch ($A_g$) for the X—X dumbbells.[22] The sharp peak in $NiSe_2$ at 205 $cm^{-1}$ corresponds to the Se—Se stretching mode of cubic $NiSe_2$, while $NiP_2$ shows two peaks at 286 and 454 $cm^{-1}$, all of which are in agreement with what was reported for pyrites.[11] The Raman spectra of $NiP_{1.93}Se_{0.07}$ and $NiP_{0.09}Se_{1.91}$ are quite similar to those of $NiP_2$ and $NiSe_2$, respectively, which further confirms the pyrite structure and doping. The Raman peak positions also confirm that formation of pure or alloy phase of $NiP_2$ for the bottom two samples without impurity phases close to $NiSe_2$, and the formation of pure or alloy phase of $NiSe_2$ for the top two samples without impurity phases close to $NiP_2$.

Figure 8A:
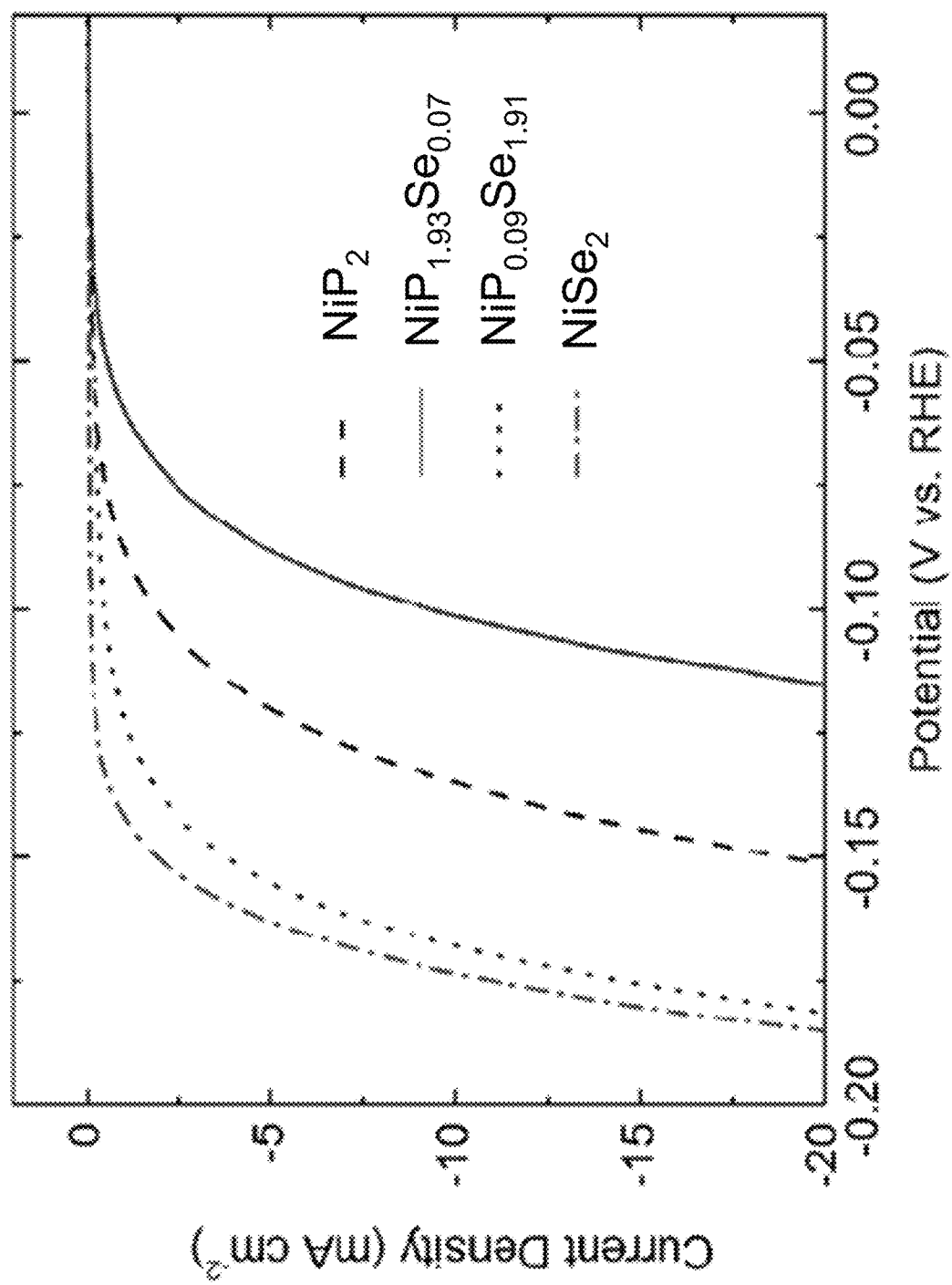
FIGS. 8a-8d show the electrochemical characterizations of $NiP_2$, $NiP_{1.93}Se_{0.07}$, $NiP_{0.09}Se_{1.91}$, and $NiSe_2$ nanostructures on graphite disk for HER electrocatalysis in 0.5 M $H_2SO_4$, including (FIG. 8a) Polarization curves, (FIG. 8b) the corresponding Tafel plots, (FIG. 8c) the plots showing the extraction of the double-layer capacitance ($C_{dl}$), and (FIG. 8d) surface area normalized Tafel plots.
Figure 8B:
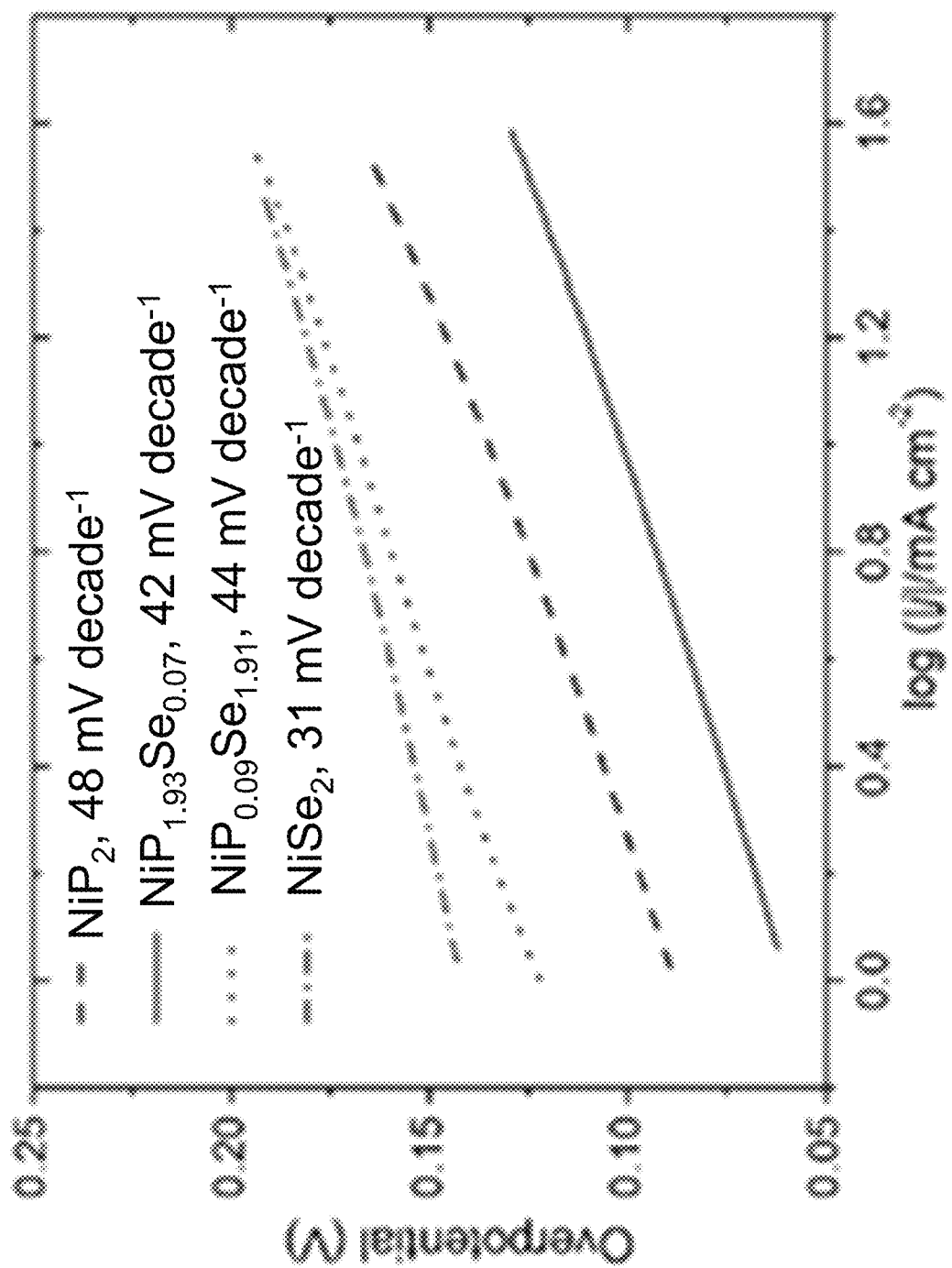

The electrocatalytic HER activities of $NiP_2$, $NiP_{1.93}Se_{0.07}$, $NiP_{0.09}Se_{1.91}$, and $NiSe_2$ nanostructures were measured using a standard three-electrode setup in 0.5 M $H_2SO_4$ (aq) with continuously purging $H_2$. The graphite disks with samples were adhered on the glassy carbon working electrode of standard RDE apparatus by silver paint. It is worth noting that graphite disk and silver paint were inactive for HER and it was very convenient to perform characterizations on it. In addition, the direct growth of nanostructures on graphite disk ensures the good electrical contact between the substrate and the electrocatalysts. All data were iR corrected and the ohmic losses were always <3.5Ω. The polarization curves (FIG. 8a) show the overpotentials needed for $NiP_2$, $NiP_{1.93}Se_{0.07}$, $NiP_{0.09}Se_{1.91}$, and $NiSe_2$ to achieve a catalytic current density of 10 mA $cm^{-2}$ are 135, 102, 167, and 173 mV vs reversible hydrogen potential (RHE), respectively. The corresponding Tafel plots (FIG. 8b) show all the Tafel plots can be well described with the Tafel equation in a relatively wide range (approximately 70 mV). The Tafel slopes of $NiP_2$, $NiP_{1.93}Se_{0.07}$, $NiP_{0.09}Se_{1.91}$, and $NiSe_2$ are calculated to be 48, 42, 44, 31 mV decade$^{-1}$, respectively.

Figure 8C:
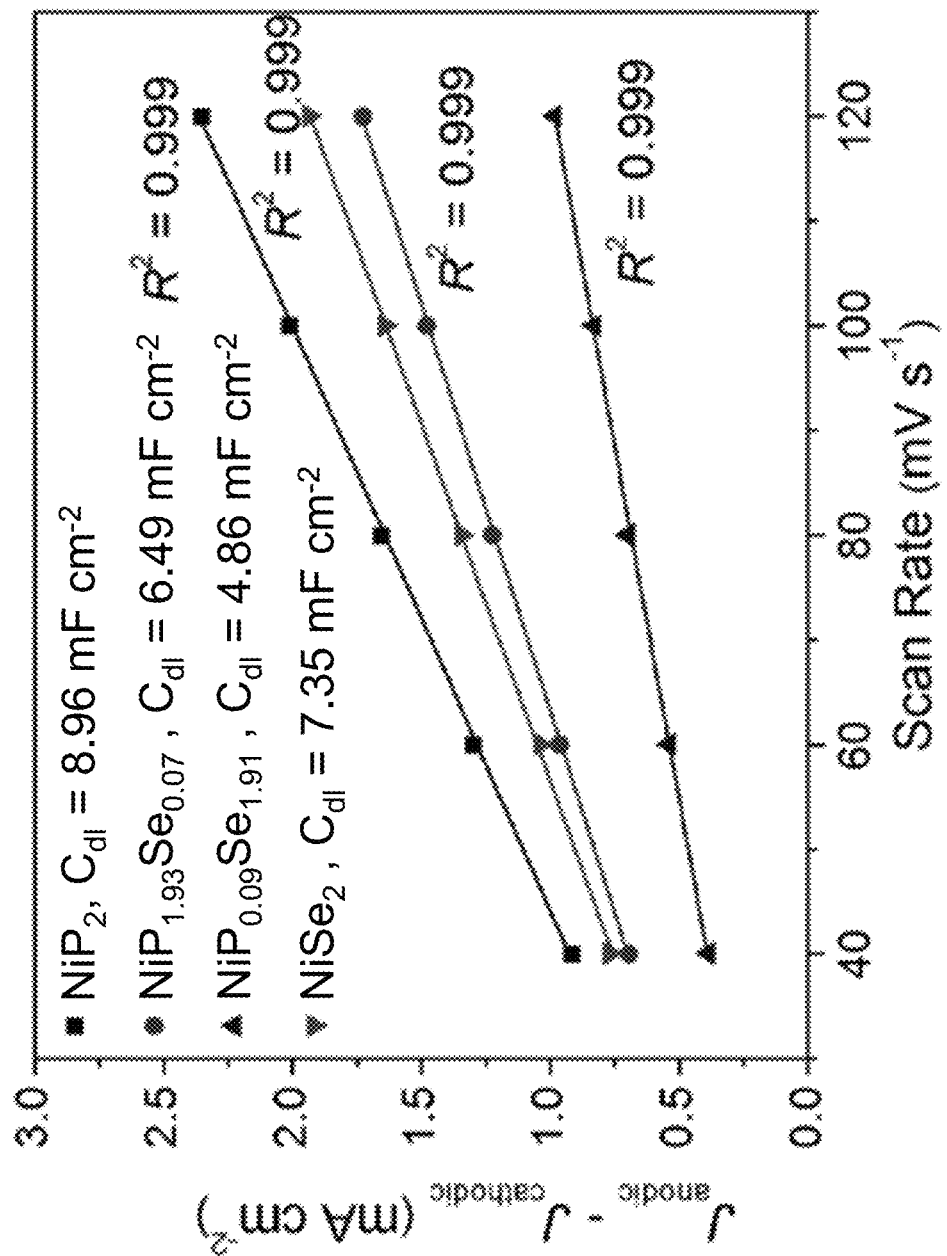
Figure 8D:
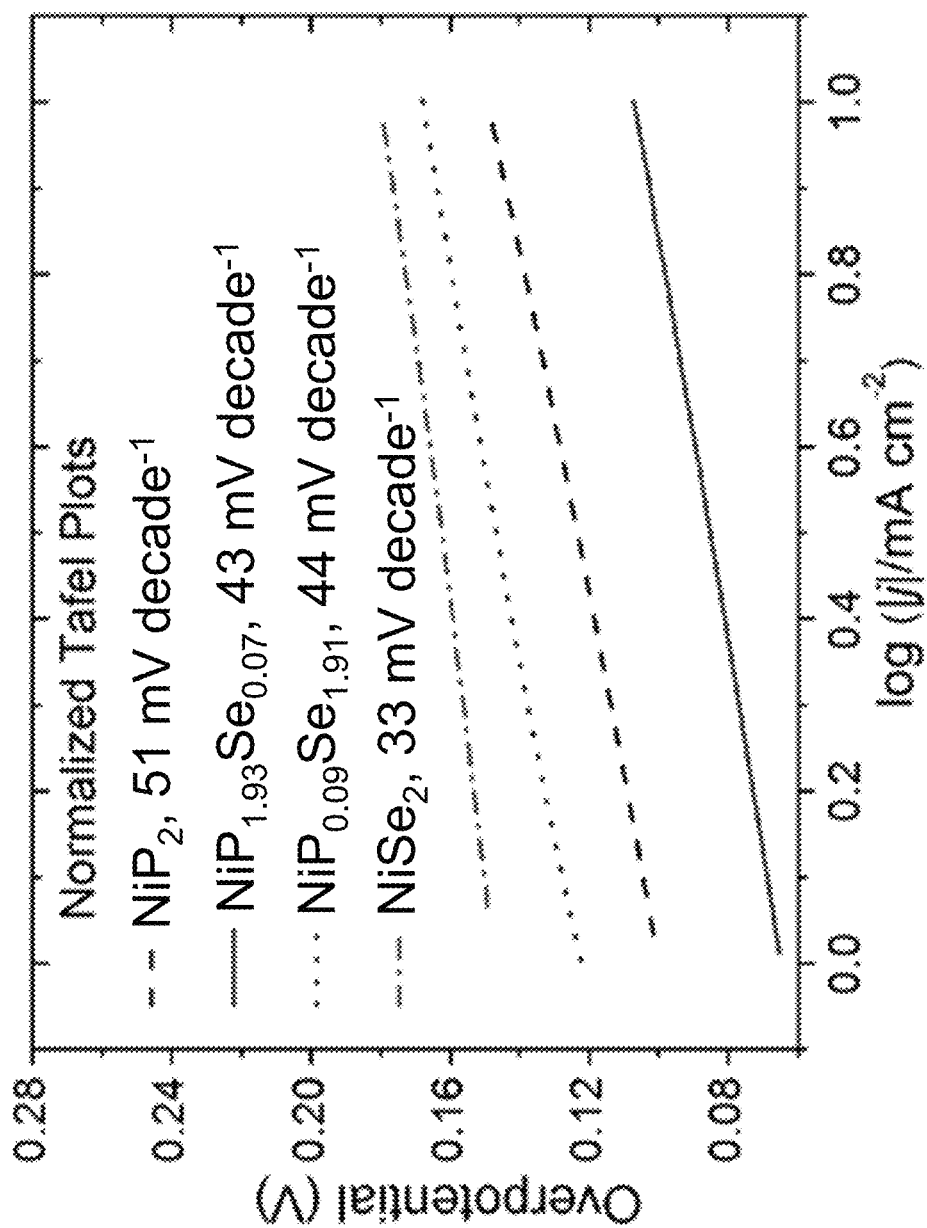

Although these samples were all converted from the same $Ni(OH)_2$ precursor nanostructures and have similar morphologies and surface areas, there were still some variations between samples. In order to compare them in a more meaningful fashion, cyclic voltammetry (CV) scans were carried out to determine the double-layer capacitance ($C_{dl}$) (FIG. 8c), which can be used to estimate the relative electrochemically active surface area assuming that the two are linearly proportional.[10] Using such relative surface areas, the electrochemical data can be normalized to determine the normalized Tafel slope and normalized exchange current density.[10] The geometric exchange current density ($J_{0,\ geometric}$), double-layer capacitance ($C_{dl}$), relative electrochemically active surface area, normalized Tafel slope, and normalized exchange current density ($J_{0,\ normalized}$) of each electrode are summarized in Table 3. The normalized exchange current densities of $NiP_2$, $NiP_{1.93}Se_{0.07}$, $NiP_{0.09}Se_{1.91}$, and $NiSe_2$ were found to be 12, 31, 1.4, and 0.038 µA cm$^{-2}$, respectively. The doping of $NiP_2$ with Se significantly improved the HER performance as evidenced by the $J_{0,\ normalized}$ of $NiP_{1.93}Se_{0.07}$, which was 2.6 times larger than that of $NiP_2$, suggesting the higher intrinsic HER activity of $NiP_{1.93}Se_{0.07}$. The doping of $NiP_2$ with Se also reduced the Tafel slope (normalized) of $NiP_2$ from 51 to 43 mV decade$^{-1}$ (FIG. 8d), which is desirable to drive a large catalytic current density at a low overpotential. Additionally, it was found that $NiP_2$ was catalytically more active than $NiSe_2$ for HER (although the Tafel slope for $NiSe_2$ is lower at 33 mV decade$^{-1}$). Although P-doping of $NiSe_2$ improved the catalytic performance, it could not surpass the performance of $NiP_2$ or Se-doped $NiP_2$. These results again confirm that the Se-doped $NiP_2$ ($NiP_{1.93}Se_{0.07}$) has the highest catalytic activity among these four compounds. The substitution of P by Se in the pyrite-phase $NiP_2$ is suggested to modify the electronic structure of $NiP_2$, which could further tune the hydrogen absorption free energy on the catalyst and improve the catalytic activity, as demonstrated in Example 1 for pyrite-phase CoPS.

Furthermore, the stability of the most catalytically active $NiP_{1.93}Se_{0.07}$ catalyst for HER was measured. The electrode of $NiP_{1.93}Se_{0.07}$ nanostructures on graphite disk can maintain a current density of 10 mA cm$^{-2}$ for ~14 h at an overpotential of 0.1 V (data not shown). The charge transfer resistance of the electrode only increased slightly from 4.5Ω to 10Ω (data not shown). The morphology of $NiP_{1.93}Se_{0.07}$ changed very little after this 14 h test (data not shown). Also, the PXRD patterns of $NiP_{1.93}Se_{0.07}$ after the test showed no significant changes (data not shown). These results demonstrate the excellent stability of $NiP_{1.93}Se_{0.07}$.

Figure 9:
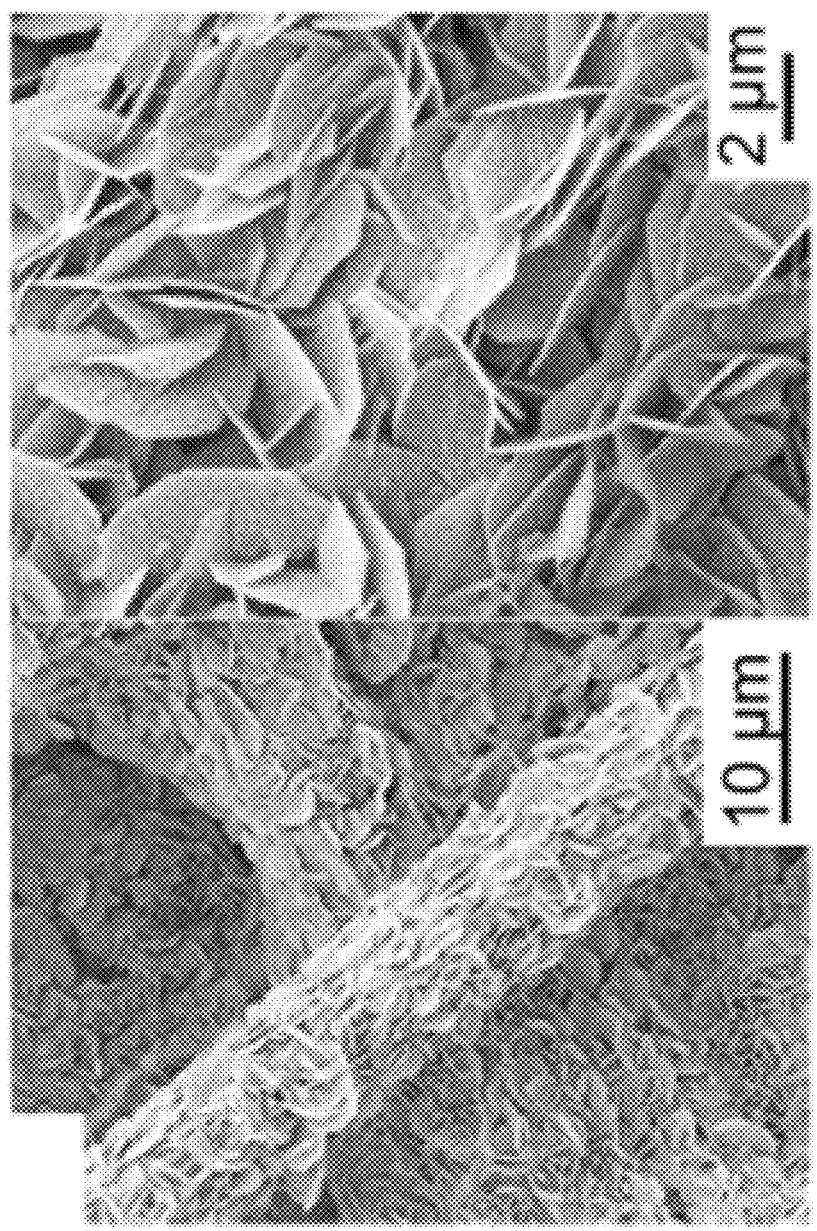
FIG. 9 shows SEM images of $NiP_{1.93}Se_{0.07}$ nanostructures on carbon fiber paper.
Figure 10A:
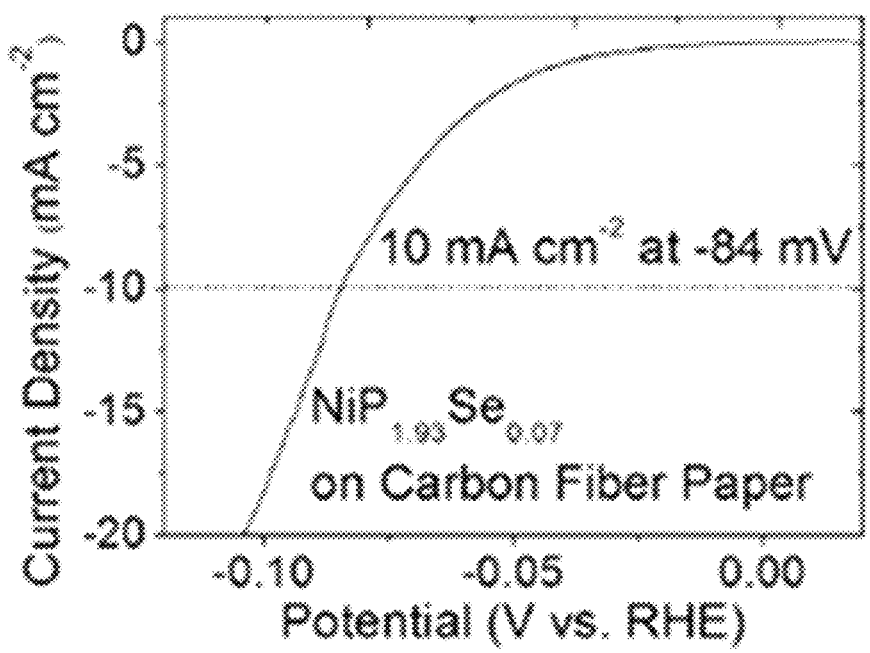
FIGS. 10a-10b show the electrochemical characterizations of the $NiP_{1.93}Se_{0.07}$ nanostructures on carbon fiber paper of FIG. 9.
Figure 10B:
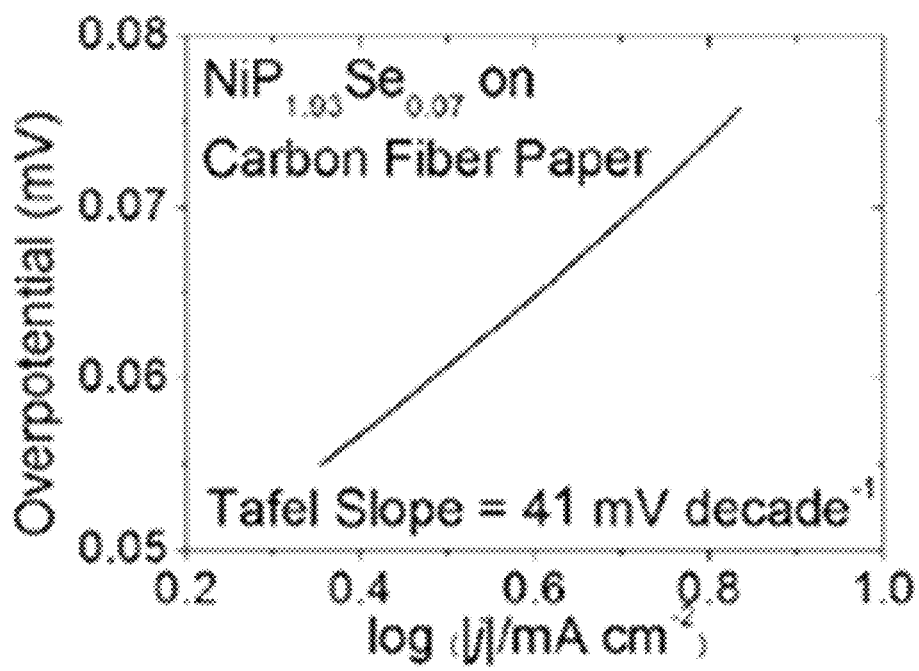

Finally, to further improve the overall catalytic performance of $NiP_{1.93}Se_{0.07}$ for HER, carbon fiber paper (CP) was employed, which has large surface area and good electrical conductivity, as the substrate to prepare high surface area three-dimensional (3D) electrodes in otherwise similar synthesis conditions. FIG. 9 displays the SEM images of $NiP_{1.93}Se_{0.07}$ nanostructures on carbon fiber paper. The PXRD patterns, polarization curves (FIG. 10a), and the corresponding Tafel plot (FIG. 10b) of $NiP_{1.93}Se_{0.07}$ nanostructures on carbon fiber paper were also obtained. The results show that the $NiP_{1.93}Se_{0.07}$/CP electrodes achieved a catalytic current density of 10 mA cm$^{-2}$ at an overpotential of 84 mV vs. RHE with a Tafel slope of 41 mV decade$^{-1}$.

Conclusion

In summary, a facile method has been developed to synthesize nanostructures of pyrite-phase $NiP_2$, nickel phosphoselenide ($NiP_{1.93}Se_{0.07}$, $NiP_{0.09}Se_{1.91}$), and $NiSe_2$. Their similar structures enable a systematic and fair comparison of their structural properties and catalytic activities for HER. The results prove that Se-doped $NiP_2$ ($NiP_{1.93}Se_{0.07}$) exhibits the highest electrocatalytic activity among the four compounds. Specifically, $NiP_{1.93}Se_{0.07}$ nanostructures grown on carbon fiber paper achieved a current density of 10 mA cm$^{-2}$ at −84 mV (vs. RHE) with a small Tafel slope of 41 mV decade$^{-1}$. These results establish $NiP_{1.93}Se_{0.07}$ as a highly active, stable, and earth-abundant electrocatalyst for HER.

REFERENCES

1 Lewis, N. S. & Nocera, D. G. Powering the planet: Chemical challenges in solar energy utilization. *Proc. Natl. Acad. Sci. U.S.A.* 103, 15729-15735 (2006).

2 Nocera, D. G. The Artificial Leaf. *Acc. Chem. Res.* 45, 767-776 (2012).

3 Turner, J. A. Sustainable Hydrogen Production. *Science* 305, 972-974 (2004).

4 Faber, M. S. & Jin, S. Earth-abundant inorganic electrocatalysts and their nanostructures for energy conversion applications. *Energy Environ. Sci.* 7, 3519-3542 (2014).

5 Lukowski, M. A., Daniel, A. S., Meng, F., Forticaux, A., Li, L. S. & Jin, S. Enhanced Hydrogen Evolution Catalysis from Chemically Exfoliated Metallic $MoS_2$ Nanosheets. *J. Am. Chem. Soc.* 135, 10274-10277 (2013).

6 Benck, J. D., Hellstern, T. R., Kibsgaard, J., Chakthranont, P. & Jaramillo, T. F. Catalyzing the Hydrogen Evolution Reaction (HER) with Molybdenum Sulfide Nanomaterials. *ACS Catal.* 4, 3957-3971 (2014).

TABLE 3

Summary of the electrochemical properties of $NiP_2$, $NiP_{1.93}Se_{0.07}$, $NiP_{0.09}Se_{1.91}$, and $NiSe_2$ on graphite disk (GD) and $NiP_{1.93}Se_{0.07}$ on carbon fiber paper (CP). The best values for each parameter among four samples on GD were highlighted with bold fonts.

| Sample/Substrate | η (mV vs. RHE) for J = −10 mA cm$^{-2}$ | Tafel slope (mV decade$^{-1}$) | $J_{0,\ geometric}$ (µA cm$^{-2}$) | $C_{dl}$ (mF cm$^{-2}$) | Relative Surface Area | Tafel slope$_{normalized}$ (mV decade$^{-1}$) | $J_{0,\ normalized}$ (µA cm$^{-2}$) |
|---|---|---|---|---|---|---|---|
| $NiP_2$/GD | 135 | 48 | 15 | 8.96 | 1.84 | 51 | 12 |
| $NiP_{1.93}Se_{0.07}$/GD | 102 | 42 | 39 | 6.49 | 1.34 | 43 | 31 |
| $NiP_{0.09}Se_{1.91}$/GD | 167 | 44 | 1.4 | 4.86 | 1.00 | 44 | 1.4 |
| $NiSe_2$/GD | 173 | 31 | 0.031 | 7.35 | 1.51 | 33 | 0.038 |
| $NiP_{1.93}Se_{0.07}$/CP | 84 | 41 | 100 | 27.6 | 5.68 | 42 | 20 |

7 Voiry, D., Yamaguchi, H., Li, J. W., Silva, R., Alves, D. C. B., Fujita, T., Chen, M. W., Asefa, T., Shenoy, V. B., Eda, G. & Chhowalla, M. Enhanced catalytic activity in strained chemically exfoliated $WS_2$ nanosheets for hydrogen evolution. *Nature Mater.* 12, 850-855 (2013).

8 Lukowski, M. A., Daniel, A. S., English, C. R., Meng, F., Forticaux, A., Hamers, R. J. & Jin, S. Highly active hydrogen evolution catalysis from metallic $WS_2$ nanosheets. *Energy Environ. Sci.* 7, 2608-2613 (2014).

9 Merki, D., Fierro, S., Vrubel, H. & Hu, X. L. Amorphous molybdenum sulfide films as catalysts for electrochemical hydrogen production in water. *Chem. Sci.* 2, 1262-1267 (2011).

10 Faber, M. S., Dziedzic, R., Lukowski, M. A., Kaiser, N. S., Ding, Q. & Jin, S. High-Performance Electrocatalysis Using Metallic Cobalt Pyrite ($CoS_2$) Micro- and Nanostructures. *J. Am. Chem. Soc.* 136, 10053-10061 (2014).

11 Kong, D. S., Wang, H. T., Lu, Z. Y. & Cui, Y. $CoSe_2$ Nanoparticles Grown on Carbon Fiber Paper: An Efficient and Stable Electrocatalyst for Hydrogen Evolution Reaction. *J. Am. Chem. Soc.* 136, 4897-4900 (2014).

12 Popczun, E. J., Read, C. G., Roske, C. W., Lewis, N. S. & Schaak, R. E. Highly Active Electrocatalysis of the Hydrogen Evolution Reaction by Cobalt Phosphide Nanoparticles. *Angew. Chem. Int. Ed.* 53, 5427-5430 (2014).

13 Liu, Q., Tian, J., Cui, W., Jiang, P., Cheng, N., Asiri, A. M. & Sun, X. Carbon Nanotubes Decorated with CoP Nanocrystals: A Highly Active Non-Noble-Metal Nanohybrid Electrocatalyst for Hydrogen Evolution. *Angewandte Chemie* 126, 6828-6832 (2014).

14 Popczun, E. J., McKone, J. R., Read, C. G., Biacchi, A. J., Wiltrout, A. M., Lewis, N. S. & Schaak, R. E. Nanostructured Nickel Phosphide as an Electrocatalyst for the Hydrogen Evolution Reaction. *J. Am. Chem. Soc.* 135, 9267-9270 (2013).

15 Callejas, J. F., McEnaney, J. M., Read, C. G., Crompton, J. C., Biacchi, A. J., Popczun, E. J., Gordon, T. R., Lewis, N. S. & Schaak, R. E. Electrocatalytic and Photocatalytic Hydrogen Production from Acidic and Neutral-pH Aqueous Solutions Using Iron Phosphide Nanoparticles. *ACS Nano* 8, 11101-11107 (2014).

16 Xiao, P., Sk, M. A., Thia, L., Ge, X., Lim, R. J., Wang, J.-Y., Lim, K. H. & Wang, X. Molybdenum phosphide as an efficient electrocatalyst for the hydrogen evolution reaction. *Energy Environ. Sci.* 7, 2624-2629 (2014).

17 McEnaney, J. M., Crompton, J. C., Callejas, J. F., Popczun, E. J., Biacchi, A. J., Lewis, N. S. & Schaak, R. E. Amorphous Molybdenum Phosphide Nanoparticles for Electrocatalytic Hydrogen Evolution. *Chem. Mater.* 26, 4826-4831 (2014).

18 Kibsgaard, J., Jaramillo, T. F. Molybdenum Phosphosulfide: An Active, Acid-Stable, Earth-Abundant Catalyst for the Hydrogen Evolution Reaction. *Angew. Chem. Int. Ed.* 53, 14433-14437 (2014).

19 McKone, J. R., Sadtler, B. F., Werlang, C. A., Lewis, N. S. & Gray, H. B. Ni—Mo Nanopowders for Efficient Electrochemical Hydrogen Evolution. *ACS Catal.* 3, 166-169 (2013).

20 McKone, J. R., Lewis, N. S. & Gray, H. B. Will Solar-Driven Water-Splitting Devices See the Light of Day? *Chem. Mater.* 26, 407-414 (2014).

21 Faber, M. S., Park, K., Cabán-Acevedo, M., Santra, P. K. & Jin, S. Earth-Abundant Cobalt Pyrite ($CoS_2$) Thin Film on Glass as a Robust, High-Performance Counter Electrode for Quantum Dot-Sensitized Solar Cells. *J. Phys. Chem. Lett.* 4, 1843-1849 (2013).

22 Faber, M. S., Lukowski, M. A., Ding, Q., Kaiser, N. S. & Jin, S. Earth-Abundant Metal Pyrites ($FeS_2$, $CoS_2$, $NiS_2$, and Their Alloys) for Highly Efficient Hydrogen Evolution and Polysulfide Reduction Electrocatalysis. *J. Phys. Chem. C* 118, 21347-21356 (2014).

23 Kong, D. S., Cha, J. J., Wang, H. T., Lee, H. R. & Cui, Y. First-row transition metal dichalcogenide catalysts for hydrogen evolution reaction. *Energy Environ. Sci.* 6, 3553-3558 (2013).

24 Cabán-Acevedo, M., Kaiser, N. S., English, C. R., Liang, D., Thompson, B. J., Chen, H.-E., Czech, K. J., Wright, J. C., Hamers, R. J. & Jin, S. Ionization of High-Density Deep Donor Defect States Explains the Low Photovoltage of Iron Pyrite Single Crystals. *J. Am. Chem. Soc.* 136, 17163-17179 (2014).

25 Ennaoui, A., Fiechter, S., Pettenkofer, C., Alonso-Vante, N., Büker, K., Bronold, M., Höpfner, C. & Tributsch, H. Iron disulfide for solar energy conversion. *Sol. Energy Mater. Sol. Cells* 29, 289-370 (1993).

26 Stiebritz, M. T. & Reiher, M. A Unifying Structural and Electronic Concept for Hmd and [FeFe] Hydrogenase Active Sites. *Inorg. Chem.* 49, 5818-5823 (2010).

27 Thauer, R. K., Kaster, A.-K., Goenrich, M., Schick, M., Hiromoto, T. & Shima, S. Hydrogenases from Methanogenic Archaea, Nickel, a Novel Cofactor, and $H_2$ Storage. *Annual Review of Biochemistry* 79, 507-536 (2010).

28 Kubas, G. J. *Metal Dihydrogen and s-Bond Complexes: Structure, Theory, and Reactivity.* (Springer Science & Business Media, 2001).

29 Ishida, K. & Nishizawa, T. The Co—P (Cobalt-Phosphorus) system. *Bulletin of Alloy Phase Diagrams* 11, 555-560 (1990).

30 Hulliger, F. New Compounds with Cobaltite Structure. *Nature* 198, 382-383 (1963).

31 Norskov, J. K., Bligaard, T., Logadottir, A., Kitchin, J. R., Chen, J. G., Pandelov, S. & Stimming, U. Trends in the Exchange Current for Hydrogen Evolution. *J. Electrochem. Soc.* 152, J23-J26 (2005).

32 Xia, X., Chao, D., Qi, X., Xiong, Q., Zhang, Y., Tu, J., Zhang, H. & Fan, H. J. Controllable Growth of Conducting Polymers Shell for Constructing High-Quality Organic/Inorganic Core/Shell Nanostructures and Their Optical-Electrochemical Properties. *Nano Lett* 13, 4562-4568 (2013).

33 Lyapin, S. G., Utyuzh, A. N., Petrova, A. E., Novikov, A. P., Lograsso, T. A. & Stishov, S. M. Raman studies of nearly half-metallic ferromagnetic $CoS_2$. *Journal of Physics: Condensed Matter* 26, 396001 (2014).

34 Moulder, J. F., Stickle W. F., Sobol P. E. & Bomben K. D. *Handbook of X-ray Photoelectron Spectroscopy.* (Perkin-Elmer Corp, 1992).

35 Biesinger, M. C., Lau, L. W. M., Gerson, A. R. & Smart, R. S. C. Resolving surface chemical states in XPS analysis of first row transition metals, oxides and hydroxides: Sc, Ti, V, Cu and Zn. *Appl. Surf. Sci.* 257, 887-898 (2010).

36 Okamoto H. P—S(Phosphorus-Sulfur). *J. Phase Equilib.* 12, 706-707 (1991).

37 Dai, P., Xie, J., Mayer, M. T., Yang, X., Zhan, J. & Wang, D. Solar Hydrogen Generation by Silicon Nanowires Modified with Platinum Nanoparticle Catalysts by Atomic Layer Deposition. *Angew. Chem. Int. Ed.* 52, 11119-11123 (2013).

38 Boettcher, S. W., Warren, E. L., Putnam, M. C., Santori, E. A., Turner-Evans, D., Kelzenberg, M. D., Walter, M. G., McKone, J. R., Brunschwig, B. S., Atwater, H. A. &

Lewis, N. S. Photoelectrochemical Hydrogen Evolution Using Si Microwire Arrays. *J. Am. Chem. Soc.* 133, 1216-1219 (2011).
39 Wang, H.-P., Lin, T.-Y., Hsu, C.-W., Tsai, M.-L., Huang, C.-H., Wei, W.-R., Huang, M.-Y., Chien, Y.-J., Yang, P.-C., Liu, C.-W., Chou, L.-J. & He, J.-H. Realizing High-Efficiency Omnidirectional n-Type Si Solar Cells via the Hierarchical Architecture Concept with Radial Junctions. *ACS Nano* 7, 9325-9335 (2013).
40 Kelzenberg, M. D., Boettcher, S. W., Petykiewicz, J. A., Turner-Evans, D. B., Putnam, M. C., Warren, E. L., Spurgeon, J. M., Briggs, R. M., Lewis, N. S. & Atwater, H. A. Enhanced absorption and carrier collection in Si wire arrays for photovoltaic applications. *Nat Mater* 9, 239-244 (2010).
41 Zhang, X., Meng, F., Mao, S., Ding, Q., Shearer, M. J., Faber, M. S., Chen, J., Hamers, R. J. & Jin, S. Amorphous $MoS_xCl_y$ electrocatalyst supported by vertical graphene for efficient electrochemical and photoelectrochemical hydrogen generation. *Energy Environ. Sci.* (2015).
42 Ding, Q., Meng, F., English, C. R., Cabán-Acevedo, M., Shearer, M. J., Liang, D., Daniel, A. S., Hamers, R. J. & Jin, S. Efficient Photoelectrochemical Hydrogen Generation Using Heterostructures of Si and Chemically Exfoliated Metallic $MoS_2$. *J. Am. Chem. Soc.* 136, 8504-8507 (2014).
43 Huang, Z., Chen, Z., Chen, Z., Lv, C., Meng, H. & Zhang, C. $Ni_{12}P_5$ Nanoparticles as an Efficient Catalyst for Hydrogen Generation via Electrolysis and Photoelectrolysis. *ACS Nano* 8, 8121-8129 (2014).
44 Hou, Y., Abrams, B. L., Vesborg, P. C. K., Björketun, M. E., Herbst, K., Bech, L., Setti, A. M., Damsgaard, C. D., Pedersen, T., Hansen, O., Rossmeisl, J., Dahl, S., Nørskov, J. K. & Chorkendorff, I. Bioinspired molecular co-catalysts bonded to a silicon photocathode for solar hydrogen evolution. *Nat Mater* 10, 434-438 (2011).
45 Benck, J. D., Lee, S. C., Fong, K. D., Kibsgaard, J., Sinclair, R. & Jaramillo, T. F. Designing Active and Stable Silicon Photocathodes for Solar Hydrogen Production Using Molybdenum Sulfide Nanomaterials. *Adv. Energy Mater.* 4, 1400739 (2014).
46 Kresse, G. & Furthmüller, J. Efficient iterative schemes for ab initio total-energy calculations using a plane-wave basis set. *Phys. Rev. B* 54, 11169 (1996).
47 Kresse, G. & Hafner, J. Ab initio molecular-dynamics simulation of the liquid-metal-amorphous-semiconductor transition in germanium. *Phys. Rev. B* 49, 14251 (1994).
48 Kresse, G. & Hafner, J. Ab initio molecular dynamics for liquid metals. *Phys. Rev. B* 47, 558 (1993).
49 Blöchl, P. E. Projector augmented-wave method. *Phys. Rev. B* 50, 17953 (1994).
50 Kresse, G. & Joubert, D. From ultrasoft pseudopotentials to the projector augmented-wave method. *Phys. Rev. B* 59, 1758 (1999).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for making an electrode, the method comprising exposing a layer of a transition metal-containing precursor disposed on a substrate to a chalcogen-phosphorous atmosphere at an elevated temperature and for a period of time to convert the transition metal-containing precursor to a ternary pyrite-phase transition metal phosphochalcogenide, wherein the ternary pyrite-phase transition metal phosphochalcogenide is a solid material of a ternary compound of a transition metal, phosphorous (P), and a chalcogen, the solid material characterized by a single, ternary alloy phase having a pyrite crystal structure.

2. The method of claim 1, wherein chemical species at the surface of the solid material are the same as chemical species in the bulk of the solid material.

3. The method of claim 1, wherein the ternary pyrite-phase transition metal phosphochalcogenide is a ternary pyrite-phase cobalt phosphochalcogenide, a ternary pyrite-phase nickel phosphochalcogenide, or combinations thereof.

4. The method of claim 1, wherein the ternary pyrite-phase transition metal phosphochalcogenide is ternary pyrite-phase cobalt phosphosulfide, ternary pyrite-phase cobalt phosphoselenide, ternary pyrite-phase nickel phosphosulfide, ternary pyrite-phase nickel phosphoselenide, or combinations thereof.

5. The method of claim 1, wherein the ternary pyrite-phase transition metal phosphochalcogenide has a formula MPX, wherein M is a transition metal selected from Co, Ni, Fe, and Mn; P is phosphorous; and X is a chalcogen selected from S, Se, and Te.

6. The method of claim 5, wherein M is a transition metal selected from Co and Ni; P is phosphorous; and X is a chalcogen selected from S and Se.

7. The method of claim 5, wherein the ternary pyrite-phase transition metal phosphochalcogenide is CoPS, CoPSe, NiPSe, or combinations thereof.

8. The method of claim 1, wherein the substrate is a carbon substrate, a metal substrate, a glass substrate, or a semiconductor substrate.

9. The method of claim 1, wherein the transition metal is alloyed with one or more other transition metals such that the ternary pyrite-phase transition metal phosphochalcogenide is an alloyed ternary pyrite-phase transition metal phosphochalcogenide.

10. The method of claim 9, wherein the alloyed ternary pyrite-phase transition metal phosphochalcogenide has a formula $M_1M_2PX$, wherein $M_1$ and $M_2$ are transition metals independently selected from Co, Ni, Fe, and Mn; P is phosphorous; and X is a chalcogen selected from S, Se, and Te.

11. The method of claim 1, wherein the solid material is in the form of nanowires, nanoplates, or combinations thereof, wherein the nanowires and the nanoplates extend vertically away from the substrate.

12. The method of claim 11, wherein the nanowires have an average diameter in the range of from 10 nm to 100 nm; and the nanoplates have an average thickness in the range of from 10 nm to 100 nm and an average width in the range of from 100 nm to 1000 nm.

13. The method of claim 1, wherein the chalcogen-phosphorous atmosphere is formed by thermally evaporating a mixture of phosphorous and chalcogen elemental powders.

14. The method of claim 1, wherein the elevated temperature is in a range of from 400° C. to 700° C. and the period of time is in a range of from 5 minutes to 2 hours.

15. The method of claim 1, wherein the layer of the transition-metal containing precursor is a film of a transition metal and the solid material is in the form of nanoparticles.

16. The method of claim 1, wherein the transition-metal containing precursor is a compound in the form of nanowires, nanoplates, or combinations thereof and the solid material is in the form of nanowires, nanoplates, or combinations thereof.

17. The method of claim 16, wherein the compound is selected from an oxide, a hydroxide, an oxyhydroxide, a hydroxide carbonate, a fluoride, a chloride, a bromide, and combinations thereof.

18. The method of claim 17, wherein the compound is the hydroxide, the hydroxide carbonate, or combinations thereof.

19. The method of claim 16, wherein the transition-metal containing precursor is formed via hydrothermal growth.

20. The method of claim 16, wherein the ternary pyrite-phase transition metal phosphochalcogenide is CoPS, CoPSe, NiPSe, or combinations thereof.

* * * * *

UNITED STATES PATENT AND TRADEMARK OFFICE
CERTIFICATE OF CORRECTION

PATENT NO. : 11,421,333 B2
APPLICATION NO. : 16/439794
DATED : August 23, 2022
INVENTOR(S) : Song Jin et al.

Page 1 of 1

It is certified that error appears in the above-identified patent and that said Letters Patent is hereby corrected as shown below:

In the Specification

Column 15, Line 21:
Delete the phrase "(FIG. 20" and replace with --(Fig. 2f)--.

Column 15, Line 26:
Delete the phrase "FIG. 20," and replace with --Fig. 2f),--.

Column 17, Line 3:
Delete the phrase "(Fig 30" and replace with --(Fig. 3f)--.

Column 18, Line 23:
Delete the phrase "COP" and replace with --$CoP_x$--.

Signed and Sealed this
Twentieth Day of December, 2022

Katherine Kelly Vidal
*Director of the United States Patent and Trademark Office*